United States Patent
Schoelkopf, III et al.

(10) Patent No.: US 10,424,712 B2
(45) Date of Patent: Sep. 24, 2019

(54) METHODS FOR MAKING A SUPERCONDUCTING DEVICE WITH AT LEAST ONE ENCLOSURE

(71) Applicant: Yale University, New Haven, CT (US)

(72) Inventors: Robert J. Schoelkopf, III, Madison, CT (US); Luigi Frunzio, North Haven, CT (US); Michel Devoret, New Haven, CT (US); Teresa Brecht, New Haven, CT (US)

(73) Assignee: Yale University, New Haven, CT (US)

( * ) Notice: Subject to any disclaimer, the term of this patent is extended or adjusted under 35 U.S.C. 154(b) by 37 days.

(21) Appl. No.: 14/761,914

(22) PCT Filed: Jan. 17, 2014

(86) PCT No.: PCT/US2014/012080
§ 371 (c)(1),
(2) Date: Jul. 17, 2015

(87) PCT Pub. No.: WO2014/168665
PCT Pub. Date: Oct. 16, 2014

(65) Prior Publication Data
US 2015/0372217 A1 Dec. 24, 2015

Related U.S. Application Data

(60) Provisional application No. 61/871,061, filed on Aug. 28, 2013, provisional application No. 61/754,298, filed on Jan. 18, 2013.

(51) Int. Cl.
*H01L 39/24* (2006.01)
*H01L 39/02* (2006.01)
(Continued)

(52) U.S. Cl.
CPC .............. *H01L 39/24* (2013.01); *H01L 27/18* (2013.01); *H01L 39/02* (2013.01); *H01L 39/045* (2013.01);
(Continued)

(58) Field of Classification Search
None
See application file for complete search history.

(56) References Cited

U.S. PATENT DOCUMENTS

| 4,344,052 A | 8/1982 | Davidson |
| 4,403,189 A | 9/1983 | Simmonds |

(Continued)

FOREIGN PATENT DOCUMENTS

| EP | 0 513 856 A2 | 11/1992 |
| EP | 2 249 173 A1 | 11/2010 |

(Continued)

OTHER PUBLICATIONS

Bergeal et al., Analog information processing at the quantum limit with a Josephson ring modulator. Nat Phys. Apr. 2010;6(4):296-302. doi: 10.1038/NPHYS1516. Epub Feb. 14, 2010, 7 pages.

(Continued)

*Primary Examiner* — Paul A Wartalowicz
(74) *Attorney, Agent, or Firm* — Wolf, Greenfield & Sacks, P.C.

(57) ABSTRACT

Some embodiments are directed to a device including multiple substrates comprising one or more troughs. The substrates are disposed such that the one or more troughs form at least one enclosure. At least one superconducting layer covers at least a portion of the at least one enclosure. Other embodiments are directed to a method for manufacturing a superconducting device. The method includes acts of forming at least one trough in at least a first substrate; covering at least a portion of the first substrate with a superconducting (Continued)

material; covering at least a portion of a second substrate with the superconducting material; and bonding the first substrate and the second substrate to form at least one enclosure comprising the at least one trough and the superconducting material.

25 Claims, 10 Drawing Sheets

(51) Int. Cl.
*H01L 27/18* (2006.01)
*H01L 39/04* (2006.01)

(52) U.S. Cl.
CPC ..... *H01L 39/2406* (2013.01); *Y10T 29/49016* (2015.01)

(56) References Cited

U.S. PATENT DOCUMENTS

| | | | |
|---|---|---|---|
| 4,585,999 A | 4/1986 | Hilbert et al. | |
| 4,780,724 A | 10/1988 | Sharma et al. | |
| 4,956,312 A * | 9/1990 | Van Laarhoven | H01L 21/76802 148/DIG. 51 |
| 5,075,655 A | 12/1991 | Pond et al. | |
| 5,105,166 A | 4/1992 | Tsukii et al. | |
| 5,186,379 A | 2/1993 | Helber, Jr. | |
| 5,254,950 A | 10/1993 | Fan et al. | |
| 5,296,457 A | 3/1994 | Cooke et al. | |
| 5,326,986 A | 7/1994 | Miller, Jr. et al. | |
| 5,493,719 A | 2/1996 | Smith et al. | |
| 5,635,834 A | 6/1997 | Sloggett et al. | |
| 5,835,512 A | 11/1998 | Wada et al. | |
| 6,549,059 B1 | 4/2003 | Johnson | |
| 6,578,018 B1 | 6/2003 | Ulyanov | |
| 6,621,374 B2 | 9/2003 | Higgins et al. | |
| 6,627,915 B1 | 9/2003 | Ustinov et al. | |
| 6,635,898 B2 | 10/2003 | Williams et al. | |
| 6,822,255 B2 | 11/2004 | Tzalenchuk et al. | |
| 6,838,694 B2 | 1/2005 | Esteve et al. | |
| 6,900,454 B2 | 5/2005 | Blais et al. | |
| 6,911,664 B2 | 6/2005 | Il'ichev et al. | |
| 6,943,368 B2 | 9/2005 | Amin et al. | |
| 7,042,005 B2 | 5/2006 | Il'ichev et al. | |
| 7,129,869 B2 | 10/2006 | Furuta et al. | |
| 7,253,654 B2 | 8/2007 | Amin | |
| 7,307,275 B2 | 12/2007 | Lidar et al. | |
| 7,364,923 B2 | 4/2008 | Lidar et al. | |
| 7,369,093 B2 | 5/2008 | Oppenlander et al. | |
| 7,533,068 B2 | 5/2009 | Maassen van den Brink et al. | |
| 7,724,083 B2 | 5/2010 | Herring et al. | |
| 7,800,395 B2 | 9/2010 | Johnson et al. | |
| 7,876,248 B2 | 1/2011 | Berkley et al. | |
| 7,899,092 B2 | 3/2011 | Malinovsky | |
| 7,932,515 B2 | 4/2011 | Bunyk | |
| 8,032,474 B2 | 10/2011 | Macready et al. | |
| 8,106,717 B2 | 1/2012 | Ichimura et al. | |
| 8,111,083 B1 | 2/2012 | Pesetski et al. | |
| 8,138,784 B2 | 3/2012 | Przybysz et al. | |
| 8,416,109 B2 | 4/2013 | Kirichenko | |
| 8,514,478 B1 | 8/2013 | Spence | |
| 8,525,619 B1 | 9/2013 | Olsson et al. | |
| 8,600,200 B1 | 12/2013 | Rakich et al. | |
| 8,642,998 B2 | 2/2014 | Gambetta et al. | |
| 8,841,764 B2 | 9/2014 | Poletto et al. | |
| 9,350,460 B2 | 5/2016 | Paik | |
| 9,379,303 B2 | 6/2016 | Gambetta et al. | |
| 9,503,063 B1 | 11/2016 | Abraham et al. | |
| 9,836,699 B1 | 12/2017 | Rigetti et al. | |
| 9,892,365 B2 | 2/2018 | Rigetti et al. | |
| 2001/0025012 A1 | 9/2001 | Tarutani et al. | |
| 2002/0188578 A1 | 12/2002 | Amin et al. | |
| 2003/0136973 A1 * | 7/2003 | Ogawa | G02B 6/423 257/99 |
| 2003/0193097 A1 | 10/2003 | Il'ichev et al. | |
| 2004/0059760 A1 | 3/2004 | Ageishi et al. | |
| 2004/0140537 A1 | 7/2004 | Il'ichev et al. | |
| 2005/0117836 A1 | 6/2005 | Franson et al. | |
| 2005/0134377 A1 | 6/2005 | Dent | |
| 2005/0224784 A1 | 10/2005 | Amin et al. | |
| 2006/0179029 A1 | 8/2006 | Vala et al. | |
| 2007/0215862 A1 | 9/2007 | Beausoleil et al. | |
| 2007/0296953 A1 | 12/2007 | Allen et al. | |
| 2008/0100175 A1 | 5/2008 | Clark | |
| 2008/0274898 A1 | 11/2008 | Johnson et al. | |
| 2009/0028340 A1 | 1/2009 | Trifonov | |
| 2009/0033369 A1 | 2/2009 | Baumgardner et al. | |
| 2009/0074355 A1 | 3/2009 | Beausoleil et al. | |
| 2009/0153180 A1 | 6/2009 | Herr et al. | |
| 2009/0232191 A1 | 9/2009 | Gupta et al. | |
| 2009/0258787 A1 | 10/2009 | Wilkie et al. | |
| 2009/0289638 A1 | 11/2009 | Farinelli et al. | |
| 2010/0241780 A1 | 9/2010 | Friesen | |
| 2010/0246152 A1 * | 9/2010 | Lin | H01L 23/60 361/783 |
| 2011/0060710 A1 | 3/2011 | Amin | |
| 2011/0079889 A1 | 4/2011 | Baillin | |
| 2012/0074509 A1 * | 3/2012 | Berg | B06B 1/0292 257/416 |
| 2012/0319085 A1 | 12/2012 | Gambetta et al. | |
| 2012/0319684 A1 | 12/2012 | Gambetta et al. | |
| 2012/0326130 A1 | 12/2012 | Maekawa et al. | |
| 2012/0326720 A1 | 12/2012 | Gambetta et al. | |
| 2013/0043945 A1 | 2/2013 | McDermott et al. | |
| 2013/0107352 A1 | 5/2013 | Santori et al. | |
| 2013/0196855 A1 | 8/2013 | Poletto et al. | |
| 2014/0112107 A1 | 4/2014 | Guo et al. | |
| 2014/0314419 A1 | 10/2014 | Paik | |
| 2015/0357550 A1 | 12/2015 | Schoelkopf, III et al. | |
| 2016/0148112 A1 | 5/2016 | Kwon | |
| 2018/0069288 A1 | 3/2018 | Minev et al. | |

FOREIGN PATENT DOCUMENTS

| | | |
|---|---|---|
| EP | 2 264 799 A1 | 12/2010 |
| GB | 1 370 647 A | 10/1974 |
| JP | 61-082449 A | 4/1986 |
| JP | 02-194638 A | 8/1990 |
| RU | 2 106 717 C1 | 3/1998 |
| RU | 2 212 671 C1 | 9/2003 |
| RU | 2010 124 198 A | 12/2011 |
| WO | WO 2012/173711 A1 | 12/2012 |
| WO | WO 2012/173712 A1 | 12/2012 |

OTHER PUBLICATIONS

Koch et al., Time-reversal symmetry breaking in circuit-QED based photon lattices. arXiv:1006.0762v2. Oct. 11, 2010. 19 pages.
Platenberg, Coupled superconducting flux qubits. Delft University of Technology. Thesis. 2007. 153 pages.
Wang, Memristors and Superconducting Quantum Interference Filters in RF Systems. Department of Electrical and Computer Engineering, Duke University. Thesis. Aug. 18, 2014, 119 pages.
Wendin et al., Superconducting quantum circuits, qubits and computing. arXiv:cond-mat/0508729v1. Aug. 30, 2005. 60 pages.
International Search Report and Written Opinion dated Nov. 13, 2014 for Application No. PCT/US2014/012080.
International Preliminary Report on Patentability dated Jul. 30, 2015 for Application No. PCT/US2014/012080.
Abdo et al., Full coherent frequency conversion between two propagating microwave modes. Phys Rev Lett. Apr. 26, 2013;110:173902.1-5. doi: 10.1103/PhysRevLett.110.173902.
Abdo et al., Josephson directional amplifier for quantum measurement of superconducting circuits. Phys Rev Lett. Apr. 25, 2014;112:167701.1-5. doi: 10.1103/PhysRevLett.112.167701.
Abdo et al., Nondegenerate three-wave mixing with the Josephson ring modulator. Phys Rev B. Jan. 16, 2013;87(1):014508.1-18. doi: 10.1103/PhysRevB.87.014508.
Albert et al., Holonomic quantum computing with cat-codes. Apr. 10, 2015. arXiv:1503.00194v2. 5 pages.

(56) References Cited

OTHER PUBLICATIONS

Albert et al., Symmetries and conserved quantities in Lindblad master equations. Phys Rev A. Feb. 2014;89(2):022118. arXiv:1310.1523v2. 15 pages.
Burgarth et al., Non-Abelian phases from quantum Zeno dynamics. Phys Rev A. Oct. 9, 2013;88:042107.1-5. doi: 10.1103/PhysRevA.88.042107.
Campagne-Ibarcq et al., Persistent control of a superconducting qubit by stroboscopic measurement feedback. Phys Rev X. 2013;3:1-7. arXiv:1301.6095v2.
Carollo et al., Coherent Quantum Evolution via Reservoir Driven Holonomies. Phys Rev Lett. Jan. 18, 2006;96;020403. arXiv:quant-ph/0507229v2. 4 pages.
Carollo et al., Geometric Phase Induced by a Cyclically Evolving Squeezed Vacuum Reservoir. Phys Rev Lett. Apr. 21, 2006;96:150403. arXiv:quant-ph/0507101v2. 5 pages.
Castellanos-Beltran et al., Amplification and squeezing of quantum noise with a tunable Josephson metamaterial. Nat Phys. Dec. 2008;4(12):928-31.
Chaturvedi et al., Berry's phase for coherent states. J Phys A: Math Gen. 1987;20(16):L1071-5.
Dasgupta et al., Decoherence-induced geometric phase in a multi-level atomic system. J Phys B: At Mol Opt Phys. Apr. 18, 2007;40(9):S127. arXiv:quant-ph/0612201v1. 10 pages.
De Ponte et al., Relaxation- and decoherence-free subspaces in networks of weakly and strongly coupled resonators. Ann Phys. Mar. 12, 2007;322:2077-84.
Devoret et al., Error-Corrected Quantum Registers for a Modular Superconducting Quantum Computer. Yale White Paper: ARO/LPS. Yale University, Departments of Applied Physics and Physics. Jan. 11, 2013. 56 pages.
Devoret et al., Superconducting Circuits for Quantum Information: An Outlook. Science. Mar. 8, 2013;339:1169-74. doi: 10.1126/science.1231930.
Duan et al., Preserving Coherence in Quantum Computation by Pairing Quantum Bits. Phys Rev Lett. Sep. 8, 1997;79(10-8):1953-6.
Eichler et al., Controlling the dynamic range of a Josephson parametric amplifier. EPJ Quantum Tech. Jan. 29, 2014;1(2). doi:10.1140/epjqt2. 19 pages.
Facchi et al., Quantum Zeno Subspaces. Phys Rev Lett. Aug. 19, 2002;89(8):080401.1-4.
Heeres et al., Cavity State Manipulation Using Photon-Number Selective Phase Gates. Phys Rev Lett. Sep 25, 2015;115:137002.1-5. doi: 10.1103/PhysRevLett.115.137002.
Hofheinz et al., Synthesizing arbitrary quantum states in a superconducting resonator. Nature. May 28, 2009;459:546-9. doi:10.1038/nature08005. Supplementary Information. 5 pages.
Hover et al., High fidelity qubit readout with the superconducting lowinductance undulatory galvanometer microwave amplifier. Appl Phys Lett. 2014;104:152601.1-4.
Hover et al., Superconducting Low-inductance Undulatory Galvanometer Microwave Amplifier. Appl Phys Lett. Feb. 7, 2012;100:063503.1-3.
Johnson et al., Dispersive readout of a flux qubit at the single-photon level. Phys Rev B. 2011;84:220503. arXiv:1109.2858v2. 5 pages.
Kamal et al., Gain, directionality, and noise in microwave SQUID amplifiers: Input-output approach. Phys Rev B. 2012;86:144510.1-12. doi: 10.1103/PhysRevB.86.144510.
Kerckhoff et al., On-chip superconducting microwave circulator from synthetic rotation. Phys Rev Appl. 2015;4:034002. arXiv:1502.06041. Submitted Feb. 21, 2015. 13 pages.
Kirchmair et al., Observation of quantum state collapse and revival due to the single-photon Kerr effect. Nature. Mar. 14, 2013;495:205-9. doi:10.1038/nature11902.
Knill et al., Theory of Quantum Error Correction for General Noise. Phys Rev Lett. Mar. 13, 2000;84(11):2525-8. arXiv:quant-ph/9908066v1. 6 pages.
Krastanov et al., Universal Control of an Oscillator with Dispersive Coupling to a Qubit. Phys Rev A. 2015;92:040303. arXiv:1502.08015. Submitted Feb. 27, 2015. 5 pages.
Leghtas et al., Confining the state of light to a quantum manifold by engineered two-photon loss. Dec. 16, 2014. arXiv:1412.4633v1. 29 pages.
Lidar et al., Decoherence-Free Subspaces for Quantum Computation. Phys Rev Lett. Sep. 21, 1998;81(12):2594-7. arXiv:quant-ph/9807004v2. 4 pages.
Lindblad, On the generators of quantum dynamical semigroups. Commun Math Phys. 1976;48(2):119-30.
Minev et al., Planar Superconducting Whispering Gallery Mode Resonators. Appl Phys Lett. Oct. 3, 2013;103:142604.1-3. doi: 10.1063/1.4824201.
Mirrahimi et al., Dynamically protected cat-qubits: a new paradigm for universal quantum computation. New J Phys. Apr. 22, 2014;16:045014. 31 pages.
Mousolou et al., Universal non-adiabatic holonomic gates in quantum dots and single-molecule magnets. New J Phys. Jan. 17, 2014;16:013029. 10 pages.
Mück et al., Superconducting Quantum Interference Device as a Near-Quantum-Limited Amplifier at 0.5 GHz. Appl Phys Lett. Feb. 12, 2001;78(7):967-9. doi: 10.1063/1.1347384.
Narla et al., Wireless Josephson amplifier. Appl Phys Lett. 2014;104:232605. doi: 10.1063/1.4883373. 6 pages.
O'Brien et al., Resonant Phase Matching of Josephson Junction Traveling Wave Parametric Amplifiers. Phys Rev Lett. Oct. 10, 2014;113:157001.1-5.
Oreshkov et al., Adiabatic Markovian Dynamics. Phys Rev Lett. Jul. 30, 2010;105(5):050503. arXiv:1002.2219v4. 7 pages.
Oreshkov et al., Fault-Tolerant Holonomic Quantum Computation. Phys Rev Lett. Feb. 20, 2009;102:070502.1-4.
Oreshkov, Holonomic Quantum Computation in Subsystems. Phys Rev Lett. Aug. 28, 2009;103(9):090502. arXiv:0905.1249v3. 5 pages.
Pachos et al., Decoherence-free dynamical and geometrical entangling phase gates. Phys Rev A. 2004;69:033817. arXiv:quant-ph/0309180v3. 10 pages.
Paik et al., Observation of High Coherence in Josephson Junction Qubits Measured in a Three-Dimensional Circuit QED Architecture. Phys Rev Lett. Dec. 5, 2011;107(24):240501. arXiv:1105.4652v4. 5 pages.
Paz-Silva et al., Zeno Effect for Quantum Computation and Control. Phys Rev Lett. Feb. 24, 2012;108(8):080501. arXiv:1104.5507v2. 7 pages.
Pillet et al., Optimal design for the Josephson mixer. Mar. 30, 2015. arXiv:1503.08185v1. 5 pages.
Ranzani et al., Graph-based analysis of nonreciprocity in coupled-mode systems. New J Phys. Oct. 15,2014;17:023024. arXiv 2014;1406.4922v2. 21 pages.
Ristè et al., Feedback Control of a Solid-State Qubit Using High-Fidelity Projective Measurement. Phys Rev Lett. Dec. 2012;109(24):240502. arXiv:1207.2944v1 [cond-mat.mes-hall]. 9 pages.
Roch et al., Observation of measurement-induced entanglement and quantum trajectories of remote superconducting qubits. Phys Rev Lett. May 2, 2014;112:170501.1-5.
Roch et al., Widely Tunable, Nondegenerate Three-Wave Mixing Microwave Device Operating near the Quantum Limit. Phys Rev Lett. Apr. 2012;108(14):147701. arXiv:1202.1315v1 [cond-mat.mes-hall]. 5 pages.
Sarandy et al., Abelian and non-Abelian geometric phases in adiabatic open quantum systems. Phys Rev A. Jun. 2006;73(6):062101. arXiv:quant-ph/0507012v3. 10 pages.
Schackert et al., Phase-preserving amplification modulator. Nature. May 2010;465(7294):64-8. near the quantum limit with a Josephson ring arXiv:0912.3407v1. 20 pages.
Schindler et al., Quantum simulation of dynamical maps with trapped ions. Nature Phys. May 19, 2013;9:361-7. arXiv:1212.2418v1. 28 pages.

(56) References Cited

OTHER PUBLICATIONS

Schoelkopf, Error-Corrected Quantum Registers for a Modular Superconducting Quantum Computer. Yale White Paper for ARO/LPS. Department of Applied Physics and Physics. Jan. 7, 2013. 53 pages.
Siddiqi et al., An RF-Driven Josephson Bifurcation Amplifier for Quantum Measurement. Phys Rev Lett. Nov. 10, 2004;93:207002. arXiv:cond-mat/0312623v1. 4 pages.
Sjöqvist, Trends: A new phase in quantum computation. Phys. 2008;1:35. doi: 10.1103/Physics.1.35. 6 pages.
Spietz et al., Input Impedance and Gain of a Gigahertz Amplifier Using a dc Superconducting Quantum Interference Device in a Quarter Wave Resonator. Appl Phys Lett. 2008;93:082506. arXiv:0806.2853v1. 4 pages.
Vijay et al., Observation of Quantum Jumps in a Superconducting Artificial Atom. Phys Rev Lett. Mar. 18, 2011;106(11):110502.1-4.
Wu et al., Time-dependent decoherence-free subspace. J Phys A: Math. Theor. Sep. 19, 2012;45(40):405305. arXiv:1205.1298v2. 7 pages.
Xu et al., Non-Adiabatic Holonomic Quantum Computation in Decoherence-Free Subspaces. Phys Rev Lett. Oct. 24, 2012;109(17):170501. arXiv:1210.6782v1. 4 pages.
Xu et al., Universal Nonadiabatic Geometric Gates in Two-Qubit Decoherence-Free Subspaces. Sci Rep. Oct. 29, 2014;4:6814. doi: 10.1038/srep06814. 5 pages.
Yaakobi et al., Parametric amplification in Josephson junction embedded transmission lines. Phys Rev B. Apr. 1, 2013;87:144301.1-9. doi: 10.1103/PhysRevB.87.144301.
Zanardi et al., Coherent quantum dynamics in steady-state manifolds of strongly dissipative systems. Phys Rev Lett. Dec. 17, 2014;113:240406. arXiv:1404.4673. 6 pages.
Zanardi et al., Geometry, robustness, and emerging unitarity in dissipation-projected dynamics. Phys Rev A. 2015;91:052324. arXiv:1412.6198. 8 pages.
Zanardi et al., Holonomic Quantum Computation. Phys Lett A. Nov. 15, 1999;264:94-9. 5 pages.
Zanardi et al., Noiseless Quantum Codes. Phys Rev Lett. Oct. 27, 1997;79(17):3306-9. arXiv:quant-ph/9705044v2. 4 pages.
Zanardi, Stabilizing Quantum Information. Phys Rev A. Dec. 5, 2000;63(1):012301. arXiv:quant-ph/9910016v2. 5 pages.
Zanardi, Virtual Quantum Subsystems. Phys Rev Lett. Aug. 13, 2001;87(7):077901. arXiv:quant-ph/0103030v2. 4 pages.
Zhang et al., Physical implementation of holonomic quantum computation in decoherence-free subspaces with trapped ions. Phys Rev A. 2006;74:034302. arXiv:quant-ph/0608068v1. 4 pages.
Zheng, Dissipation-induced geometric phase for an atom in captivity QED. Phys Rev A. May 10, 2012;85(5):052106. arXiv:1205.0984v2. 7 pages.
Zheng, Open-system geometric phase based on system-reservoir joint state evolution. Phys Rev A. Jun. 27, 2014;89:062118. arXiv:1405.1227v1. 8 pages.
Zhu et al., Geometric quantum gates robust against stochastic control errors. Phys Rev A. Aug. 15, 2005;72(2):020301. arXiv:quant-ph/0407177v1. 4 pages.
Extended European Search Report dated Aug. 12, 2016 for Application No. EP 14783459.2.
Houck et al., Life after charge noise: recent results with transmon qubits. Quantum Info Process. Feb. 11, 2009;8(2-3):105-15.
Extended European Search Report dated Aug. 18, 2016 for Application No. EP 14778477.1.
International Search Report and Written Opinion dated Nov. 13, 2014 for Application No. PCT/US2014/012073.
International Preliminary Report on Patentability dated Jul. 30, 2015 for Application No. PCT/US2014/012073.
International Search Report and Written Opinion for International Application No. PCT/US2016/019801 dated May 23, 2016.
International Preliminary Report on Patentability for International Application No. PCT/US2014/012080 dated Jul. 30, 2015.
Extended European Search Report for European Application No. EP 16756456.6 dated Oct. 19, 2018.
International Search Report and Written Opinion for International Application No. PCT/US2018/020197 dated May 29, 2018.
Abdo et al., Directional amplification with a Josephson circuit. Phys Rev X. 2013;3:031001.
Abdo et al., Josephson amplifier for qubit readout. Appl Phys Lett. 2011;99(16):162506. doi: 10.1063/1.3653473.
Bell et al., Quantum superinductor with tunable nonlinearity. Phys Rev Lett. 2012;109:137003. doi:10.1103/PhysRevLett.109.137003.
Bergeal et al., Phase-preserving amplification near the quantum limit with a Josephson ring modulator. Nature. May 6, 2010;465(7294):64-8. doi: 10.1038/nature09035.
Brown et al., Microwave and millimeter-wave high-Q micromachined resonators. Int J RF and Microwave CAE. 1999;9:326-37.
Campagne-Ibarcq et al., Deterministic remote entanglement of superconducting circuits through microwave two-photon transitions. Phys Rev Lett. May 16, 2018;120:200501.
Catelani et al., Decoherence of superconducting qubits caused by quasiparticle tunneling. Phys Rev B. 2012;86:184514.
Catelani et al., Quasiparticle Relaxation of Superconducting Qubits in the Presence of Flux. Phys Rev Lett. 2011;106:077002.
Catelani et al., Relaxation and frequency shifts induced by quasiparticles in superconducting qubits. Phys Rev. 2011;B84:064517.
Chow et al., Detecting highly entangled states with a joint qubit readout. Phys Rev A. 2010;81:062325.
Chow et al., Optimized driving of superconducting artificial atoms for improved single-qubit gates. Phys Rev. 2010;A82:040305.
Chow et al., Universal quantum gate set approaching fault-tolerant thresholds with superconducting qubits. Phys Rev Lett. 2012;109:060501.
Chu et al., Quantum acoustics with superconducting qubits. Science. 2017;358:199-202.
Chu et al., Suspending superconducting qubits by silicon micromachining. Appl Phys Lett. 2016;109:112601.
Clarke et al., Superconducting quantum bits. Nature. Jun. 19, 2008;453(7198):1031-42. doi: 10.1038/nature07128.
Devoret et al., Implementing qubits with superconducting integrated circuits. Experimental Aspects of Quantum Computing. 2005:163-203.
Dicarlo et al., Demonstration of two-qubit algorithms with a superconducting quantum processor. Nature. Jul. 9, 2009;460(7252):240-4. doi: 10.1038/nature08121. Epub Jun. 28, 2009.
Dicarlo et al., Preparation and measurement of three-qubit entanglement in a superconducting circuit. Nature. Sep. 30, 2010;467(7315):574-8. doi: 10.1038/nature09416.
Elliott et al., Enhancement and state tomography of a squeezed vacuum with circuit quantum electrodynamics. Phys Rev A. 2015;92:013826.
Frattini et al., 3-wave mixing Josephson dipole element. Appl Phys Lett. 2017;110:222603.
Gao et al., Programmable interference between two microwave quantum memories. Phys Rev X. 2018;(8):021073.
Geerlings et al., Improving the Quality Factor of Microwave Compact Resonators by Optimizing their Geometrical Parameters. App Phys Lett. 2012;100:192601.
Ginossar et al., Nonlinear oscillators and high fidelity qubit state measurement in circuit quantum electrodynamics. Fluctuating Nonlinear Oscillators. Nanomechanics to quantum superconducting circuits. Oxford University Press. 2012. Chapter 8:198-216.
Girvin et al., Circuit QED and engineering charge-based superconducting qubits. Physica Scripta. 2009;T137:014012.
Hofheinz et al., Generation of Fock states in a superconducting quantum circuit. Nature. Jul. 17, 2008;454(7202):310-4. doi: 10.1038/nature07136.
Houck et al., Controlling the spontaneous emission of a superconducting transmon qubit. Phys Rev Lett. 2008;101:080502.
Johnson et al., Quantum non-demolition detection of single microwave photons in a circuit. Nature. 2010;6:663-667.
Kamal et al., Noiseless nonreciprocity in a parametric active device. Nature Physics. 2011;7:311-15.
Kamal et al., Signal-to-pump back action and self-oscillation in double pump Josephson parametric amplifier. Phys Rev B. 2009;79:184301.

(56) References Cited

OTHER PUBLICATIONS

Kerman, Metastable superconducting qubit. Phys Rev Lett. 2010;104:027002.

Kirchmair et al., Observation of quantum state collapse and revival due to the single-photon Kerr effect. Nature. Mar. 14, 2013;495(7440):205-9. doi: 10.1038/nature11902.

Koch et al., Charge-insensitive qubit design derived from the Cooper pair box. Phys Rev A. 2007;76:042319.

Koch et al., Charging effects in the inductively shunted Josephson junction. Phys Rev Lett. 2009;103:217004.

Kuhr et al., Ultrahigh finesse Fabry-Perot superconducting resonator. Appl Phys Lett. 2007;90:164101.

Lee et al. Chemically etched ultrahigh-Q wedge-resonator on a silicon chip. Nature Photonics. 2012;6:369-73.

Leghtas et al., Deterministric protocol for mapping a qubit to coherent state superpositions in a cavity. Phys Rev A. 2013;87:042315.

Leghtas et al., Hardware-efficient autonomous quantum memory protection. Phys Rev Lett. 2013;111:120501.

Leghtas et al., Quantum engineering. Confining the state of light to a quantum manifold by engineered two-photon loss. Science. Feb. 20, 2015;347(6224):853-7. doi: 10.1126/science.aaa2085.

Lucero et al., Computing prime factors with a Josephson phase qubit quantum processor. Nature Phys. 2012;8:719-723.

Manucharyan et al., Fluxonium: single Cooper-pair circuit free of charge offsets. Science. 2009;326:113-6.

Martinis et al., Decoherence in Josephson qubits from dielectric loss. Phys. Rev. Lett. Nov. 16, 2005;95(21):210503.

Masluk et al., Microwave characterization of Josephson junction arrays: Implementing a low loss superinductance. Phys Rev Lett. 2012;109:137002.

Murch et al., Quantum state sensitivity of an autoresonant superconducting circuit. Phys Rev B. 2012;86:220503.

Narla et al., Robust concurrent remote entanglement between two superconducting qubits. Phys Rev X. 2016;6:031036.

Nigg et al., Black-box superconducting circuit quantization. Phys Rev Lett. 2012;108:240502.

Nigg et al., Stabilizer quantum error correction toolbox for superconducting qubits. Phys Rev Lett. 2013;110:243604.

Ofek et al., Extending the lifetime of a quantum bit with error correction in superconducting circuits. Nature. 2016;536:441-445.

Pfaff et al., Controlled release of multiphoton quantum states from a microwave cavity memory. Nature Phys. 2017;13(9):882-887.

Reagor et al., Quantum Memory with Millisecond Coherence in Circuit QED. Phys Rev B. 2016;94:014506.

Reagor et al., Reaching 10 ms single photon lifetimes for superconducting aluminum cavities. Appl Phys Lett. 2013;102:192604.

Reed et al., Fast reset and suppressing spontaneous emission of a superconducting qubit. App. Phys. Lett. 2010;96:203110.

Reed et al., High-Fidelity readout in circuit quantum electrodynamics using the Jaynes-Cummings nonlinearity. Phys Rev Lett. 2010;105:173601.

Reed et al., Realization of three-qubit quantum error correction with superconducting circuits. Nature. 2012;482:382.

Rigetti et al., Superconducting qubit in waveguide cavity with coherence time approaching 0.1ms. Phys Rev B. 2012;86,100506.

Ristè et al., Millisecond charge-parity fluctuations and induced decoherence in a superconducting transmon qubit. Nat Commun. 2013;4:1913. doi: 10.1038/ncomms2936.

Rosenblum et al., Fault-tolerant detection of a quantum error. Science. Jul. 20, 2018;361(6399):266-70.

Sank et al., Measurement-induced state transitions in a superconducting qubit: beyond the rotating wave approximation. Phys Rev Lett. 2016;117:190503.

Sayrin et al., Real-time quantum feedback prepares and stabilizes photon No. states. Nature. Aug. 31, 2011;477(7362):73-7. doi: 10.1038/nature10376.

Schoelkopf et al., Wiring up quantum systems. Nature. Feb. 7, 2008;451(7179):664-9. doi: 10.1038/451664a.

Schuster et al., Cavity QED in a molecular ion trap. Phys Rev A. 2011;83:012311.

Schuster et al., Resolving photon number states in a superconducting circuit. Nature. Feb. 1, 2007;445(7127):515-8.

Sears et al., Photon shot noise dephasing in the strong-dispersive limit of circuit QED. Phys Rev B. 2012;86:180504.

Steffen et al., High-coherence hybrid superconducting qubit. Phys Rev Lett. 2010;105:100502.

Sun et al., Measurements of quasiparticle tunneling dynamics in a band-gap-engineered transmon qubit. Phys Rev Lett. 2012;108:230509.

Verney et al., Structural instability of driven Josephson circuits prevented by an inductive shunt. Phys Rev Appl. Feb. 1, 2019;11:024003.

Vijay et al., Quantum feedback control of a superconducting qubit: Persistent: Rabi oscillations. Nature. 2012;490:77-80.

Vijay et al., Stabilizing Rabi oscillations in a superconducting qubit using quantum feedback. Nature. Oct. 4, 2012;490(7418):77-80. doi: 10.1038/nature11505.

Vion et al., Manipulating the quantum state of an electrical circuit. Science. May 3, 2002;296(5569):886-9.

Wallraff et al., Approaching unit visibility for control of a superconducting qubit with dispersive readout. Phys Rev Lett. 2005;95:060501-060504.

Wallraff et al., Strong coupling of a single photon to a superconducting qubit using circuit quantum electrodynamics. Nature. Sep. 9, 2004;431(7005):162-7.

Wang et al., A Schrödinger cat living in two boxes. Science. May 27. 2016;352(6289):1087-91. doi: 10.1126/science.aaf2941.

Wang et al., Surface participation and dielectric loss in superconducting qubits. Appl Phys Lett. 2015;107:162601.

You et al., Superconducting qubits and quantum information. Physics Today. 2005;58(11):42.

Zmuidzinas, Superconducting microresonators: physics and applications. Annu Rev Condens Matter Phys. 2012;3:169-214.

* cited by examiner

METHODS FOR MAKING A SUPERCONDUCTING DEVICE WITH AT LEAST ONE ENCLOSURE

RELATED APPLICATIONS

This application is the national phase of International Application No. PCT/US2014/012080, files Jan. 17, 2014, and claims priority under 35 U.S.C. § 119(e) to U.S. application No. 61/754298, filed Jan. 18, 2013, titled, ERROR-CORRECTED QUANTUM REGISTERS FOR A MODULAR SUPERCONDUCTING QUANTUM COMPUTER, and U.S. application No. 61/871061, filed Aug. 28, 2013, titled, ERROR-CORRECTED QUANTUM REGISTERS FOR A MODULAR SUPERCONDUCTING QUANTUM COMPUTER, which applications are hereby incorporated by reference to the maximum extent allowable by law.

FEDERALLY SPONSORED RESEARCH

This invention was made with government support under Grant No. W911NF-09-1-0514 awarded by United States Army—Army Research Office. The US government has certain rights in the invention.

BACKGROUND

The present application relates generally to superconducting devices and methods of making superconducting devices. More specifically, the present application relates to superconducting devices formed from multiple substrates configured to exhibit quantum mechanical phenomena and methods for making such devices.

Quantum information processing uses quantum mechanical phenomena, such as energy quantization, superposition, and entanglement, to encode and process information in a way not utilized by conventional information processing. For example, it is known that certain computational problems may be solved more efficiently using quantum computation rather than conventional classical computation. However, to become a viable computational option, quantum computation requires the ability to precisely control a large number of quantum bits, known as "qubits," and the interactions between these qubits. In particular, qubits should have long coherence times, be able to be individually manipulated, be able to interact with one or more other qubits to implement multi-qubit gates, be able to be initialized and measured efficiently, and be scalable to large numbers of qubits.

A qubit may be formed from any physical quantum mechanical system with at least two orthogonal states. The two states of the system used to encode information are referred to as the "computational basis." For example, photon polarization, electron spin, and nuclear spin are two-level systems that may encode information and may therefore be used as a qubit for quantum information processing. Different physical implementations of qubits have different advantages and disadvantages. For example, photon polarization benefits from long coherence times and simple single qubit manipulation, but suffers from the inability to create simple multi-qubit gates.

Different types of superconducting qubits using Josephson junctions have been proposed, including "phase qubits," where the computational basis is the quantized energy states of Cooper pairs in a Josephson Junction; "flux qubits," where the computational basis is the direction of circulating current flow in a superconducting loop; and "charge qubits," where the computational basis is the presence or absence of a Cooper pair on a superconducting island. Superconducting qubits are an advantageous choice of qubit because the coupling between two qubits is strong making two-qubit gates relatively simple to implement, and superconducting qubits are scalable because they are mesoscopic components that may be formed using conventional electronic circuitry techniques.

SUMMARY

The inventors have recognized and appreciated that superconducting devices may be manufactured using conventional microelectronic fabrication techniques. Accordingly, embodiments are directed to superconducting devices and methods for manufacturing superconducting devices.

Some embodiments are directed to a device including multiple substrates comprising one or more troughs. The substrates are disposed such that the one or more troughs form at least one enclosure. At least one superconducting layer covers at least a portion of the at least one enclosure. In some embodiments, the plurality of substrates comprise a material with a crystalline structure, such as silicon.

In some embodiments, the at least one enclosure is configured to form at least one three-dimensional cavity resonator such that electromagnetic radiation at one or more frequencies resonates within the at least one three-dimensional cavity resonator. The one or more frequencies may include at least one microwave frequency. A Q factor of the at least one three-dimensional cavity resonator may be greater than ten million. In some embodiments, the at least one three-dimensional cavity resonator comprises a first three-dimensional cavity resonator and a second three-dimensional cavity resonator. A Q factor of the first three-dimensional cavity resonator may be greater than a Q factor of the second three-dimensional cavity resonator.

In some embodiments, at least one superconducting qubit is coupled to the at least one three-dimensional cavity resonator. The at least one superconducting qubit may be a transmon qubit or a fluxonium qubit. In some embodiments, a superconducting wiring layer is disposed on and/or in a first substrate of the plurality of substrates. The superconducting wiring layer may be configured to couple the at least one superconducting qubit to the at least one three-dimensional cavity resonator. In some embodiments, at least one aperture in the at least one superconducting is configured to couple the superconducting wiring layer to the at least one three-dimensional cavity resonator. At least one via may connect the superconducting wiring layer to at least one superconducting component of a second substrate of the plurality of substrates.

In some embodiments, the at least one superconducting qubit is disposed within the at least one three-dimensional cavity resonator such that the at least one superconducting qubit is configured to couple to the at least one three-dimensional cavity resonator via electromagnetic radiation.

In some embodiments, the plurality of substrates of the device include a first substrate and a second substrate. The first substrate may include a first trough of the one or more troughs. The at least one superconducting layer may include a first superconducting layer that covers at least a portion of the first trough; and a second superconducting layer that covers at least a portion of a surface of the second substrate. The first substrate and the second substrate may be disposed such that the first superconducting layer and the second superconducting layer are in direct contact and the first trough forms the at least one three-dimensional cavity resonator.

In some embodiments, the at least one enclosure is configured to form at least one electromagnetic shield such that external electromagnetic radiation is prevented from entering the at least one enclosure. At least one superconducting component may be disposed within the at least one electromagnetic shield. The at least one superconducting component may include at least one superconducting circuit, at least one qubit and/or at least on stripline resonator.

In some embodiments, the plurality of substrates comprises a first substrate and a second substrate. The first substrate may include a first trough of the one or more troughs and the second substrate may include a second trough of the one or more troughs. The at least one superconducting layer may include a first superconducting layer that covers at least a portion of the first trough and a second superconducting layer that covers at least a portion of the second trough. The first substrate and the second substrate may be disposed such that the first trough and the second trough form the at least one enclosure. The at least one stripline resonator may be disposed within the at least one electromagnetic shield. In some embodiments, at least one support layer suspended within the at least one electromagnetic shield, wherein the at least one stripline resonator is disposed on and/or in the at least one support layer. The at least one support layer may include at least one material selected from the group consisting of silicon, silicon oxide, and silicon nitride. In some embodiments, the at least one electromagnetic shield is configure to be a part of a circuit associated with the at least one stripline resonator.

In some embodiments, the one or more troughs comprises a first trough with a first trough surface opposed to a second trough surface, wherein the first trough surface is not parallel to the second trough surface. The at least one surface of the one or more troughs may be atomically smooth. The at least one enclosure may evacuated to a pressure less than atmospheric pressure.

Some embodiments are directed to a method for manufacturing a superconducting device. The method includes acts of forming at least one trough in at least a first substrate; covering at least a portion of the first substrate with a superconducting material; covering at least a portion of a second substrate with the superconducting material; and bonding the first substrate and the second substrate to form at least one enclosure comprising the at least one trough and the superconducting material.

In some embodiments, the act of forming the at least one trough includes acts of: forming a mask layer that covers a portion of the first substrate; and etching a portion of the first substrate not covered by the mask layer. The act of etching may include an act of anisotropic etching using, for example, a wet etchant. The mask layer may include silicon nitride.

In some embodiments, the act of covering at least a portion of the first substrate with a superconducting material includes acts of: forming a seed layer on at least the portion of the first substrate; and electroplating the superconducting material onto the seed layer. The superconducting material may include one or more of aluminum, niobium, indium, rhenium, tantalum, titanium nitride, and niobium nitride.

In some embodiments, the method further includes acts of: forming channels in at least one wiring layer substrate; covering at least a portion of the channels with the superconducting material to form a wiring layer; and bonding the at least one wiring substrate to the first substrate and/or the second substrate. The act of forming at least one trough in at least a first substrate may include: forming a first trough in the first substrate; and forming a second trough in the second substrate, wherein the at least one enclosure comprises a first enclosure formed from the first trough and the second trough. In some embodiments, the at least one enclosure is configured to form at least one electromagnetic shield such that external electromagnetic radiation is prevented from entering the at least one enclosure. At least one superconducting component may be formed within the first enclosure. The at least one superconducting component may include at least one superconducting circuit, at least one qubit and/or at least one stripline resonator. In some embodiments, at least a portion of said second substrate is covered with a support layer and at least one qubit is disposed on and/or within the support layer within the cavity.

In some embodiments, the act of forming at least one trough in at least a first substrate further comprises forming a third trough in a third substrate, the method further comprising: covering at least a portion of the third substrate with the superconducting material; covering at least a portion of a fourth substrate with the superconducting material; bonding the third substrate and the fourth substrate to form a memory layer comprising a second enclosure from the third trough; and bonding the memory layer to the at least one wiring layer. The wiring layer may couple the second enclosure to the first enclosure. The first enclosure may be electrically connected to the wiring layer through at least one via. In some embodiments, a Q factor of the second enclosure is greater than a Q factor of the first enclosure.

In some embodiments, the method may also include coupling at least one qubit to the at least one enclosure. Coupling the at least one qubit to the at least one enclosure may include forming the at least one qubit within the at least one enclosure and/or forming the at least one qubit within the at least one enclosure. The at least one qubit may be a transmon qubit or a fluxonium qubit.

In some embodiments, the at least one enclosure is configured to form at least one three-dimensional cavity resonator such that electromagnetic radiation at one or more frequencies resonates within the at least one three-dimensional cavity resonator.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
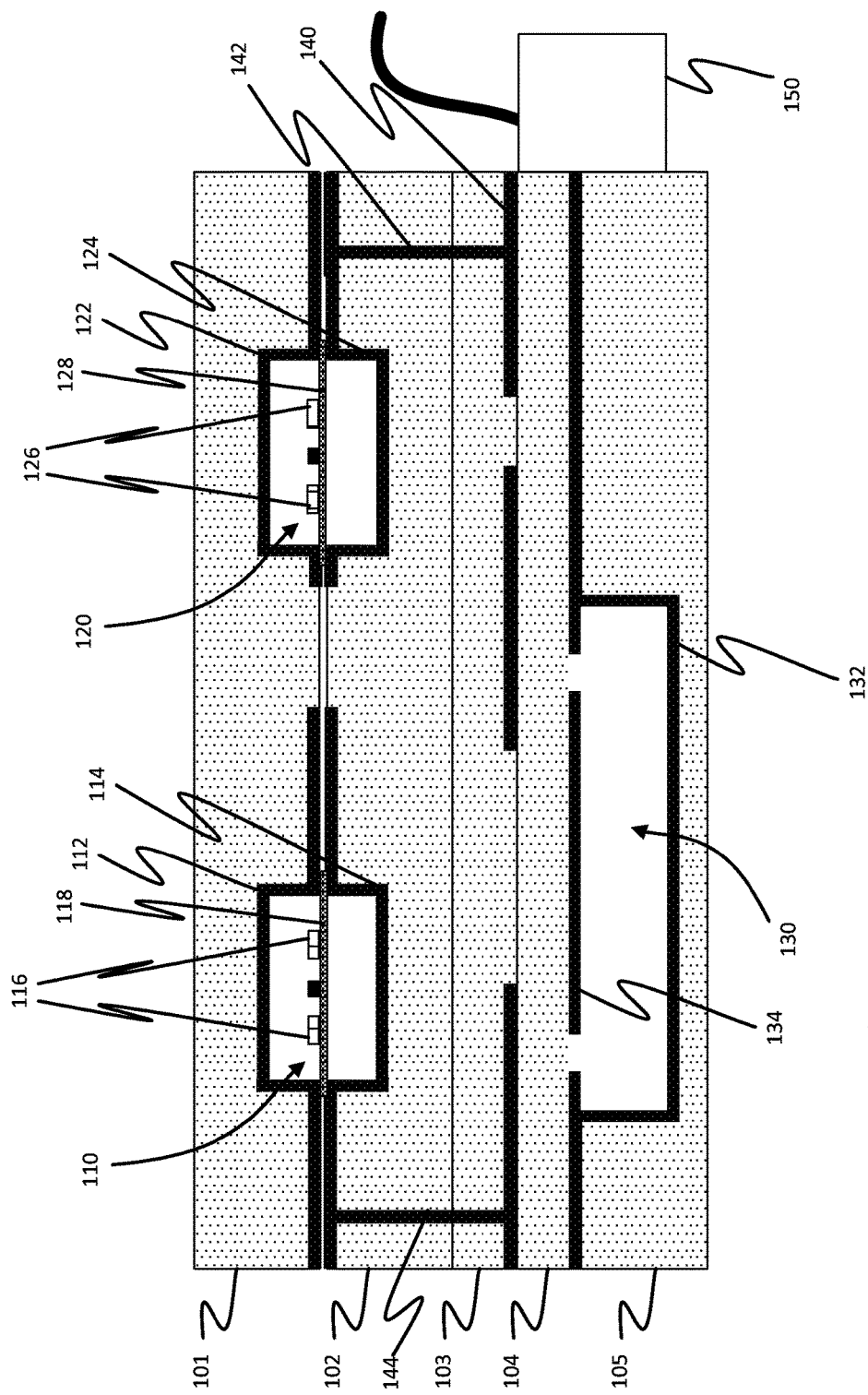
FIG. 1 illustrates a cross-sectional view of a superconducting device comprising a plurality of substrates and superconducting layers disposed to form a plurality of enclosures according to some embodiments.

The inventors have recognized and appreciated that the coherence times of superconducting devices can be significantly increased by using microelectronic fabrication techniques to form three-dimensional cavity resonators. These devices are less-sensitive to materials imperfections of both insulating substrates and conductors than more conventional, planar circuits. Significantly improved coherence times have been observed with three-dimensional resonators fabricated by conventional means. Such three-dimensional resonators may also benefit, in some embodiments, from having highly smoothed surfaces with few imperfections, that can result from etching techniques. In some embodiments, a three-dimensional cavity resonator may be used as a long-lived memory for quantum information. A superconducting qubit may be coupled to the three-dimensional cavity resonator such that quantum information transferred from the superconducting qubit to the photonic energy states of the three-dimensional cavity resonator. In some embodiments, one or more superconducting qubits may be coupled to a three-dimensional cavity resonator through a wiring layer. In other embodiments, one or more superconducting qubits may be disposed within the three-dimensional cavity resonator such that electromagnetic radiation within the cavity couples directly to the one or more superconducting qubits.

The inventors have recognized and appreciated that an enclosure formed from a superconducting material may shield components within the cavity from external electromagnetic noise, and prevent decoherence by suppressing losses due to electromagnetic radiation by the quantum circuit, even when the thickness of the superconducting material is small. Thus, superconducting layers may be formed to cover substrate layers to create precise, easily scaled superconducting devices. In some embodiments, an electromagnetic shield may enclose one or more superconducting qubits to shield the qubits from external noise, thereby increasing the performance of the superconducting qubits. For example, a stripline resonator comprising a plurality of superconducting qubits that act as a quantum bus may be disposed within an electromagnetic shield enclosure. Moreover, thin superconducting shields constructed between the parts or subunits of a large quantum processor will improve performance, reliability, and ease of calibration of the quantum device. In some embodiments, the quantum bus may be coupled to one or more other superconducting components such that quantum information from a first component may be transferred to a second component.

The inventors have also recognized and appreciated that using microelectronic fabrication techniques to manufacture superconducting devices comprising at least one superconducting enclosure for use in quantum information processing allows scalability that is not available when cavities are formed from bulk material. In some embodiments, a plurality of enclosures and superconducting qubits may be formed in a single device by forming troughs in a plurality of substrates and bonding the substrates together. In some embodiments, one or more wiring layers may be used to connect components together and or connect components to external devices. In some embodiments, one or more vias may interconnect components and/or wiring layers that are in different substrate layers. In this way, a plurality of superconducting qubits and/or enclosures may be interconnected in a compact space.

Microelectronic fabrication techniques are processes used in the manufacture of, for example, micrometer sized structures for semiconductor devices and/or microelectromechanical systems (MEMS). Examples of microelectronic fabrication techniques include, but are not limited to: deposition techniques, such as chemical vapor deposition (CVD) and physical vapor deposition (PVD); photolithography; etching techniques, such as dry etching, wet etching, reactive ion etching (RIE), isotropic etching and anisotropic etching; chemical-mechanical planarization; ion implantation techniques; and thermal oxidation techniques.

Throughout the present application, the term "enclosure" is used to describe a combination of superconducting layers that define a region of space that may be empty space or contain one or more superconducting devices of various types such as wiring, qubits, resonators, cavities, or other active devices within one or more substrates. A "three-dimensional cavity resonator" is a type of enclosure that is configured to support resonant electromagnetic radiation. An "electromagnetic shield" is a type of enclosure that is configured to prevent external electromagnetic radiation from entering the enclosure and prevent internal electromagnetic radiation from leaking out of the enclosure to the external environment.

FIG. 1 illustrates a superconducting device 100 according to one embodiment. The superconducting device comprises a plurality of substrates 101-105 that are bonded together in any suitable way. For example, two substrates that have been covered, at least partially, with a metal material may be bonded together using cold welding, thermocompression bonding, thermosonic bonding, eutectic bonding or solder reflow. Any suitable number of substrates may be bonded together to form superconducting device 100. The embodiment illustrated in FIG. 1 shows five separate substrates 101-105, but embodiments are not so limited. For example, some embodiments may bond only two substrates together.

The different substrates of the superconducting device 100 may serve different purposes. For example, substrate 101 and substrate 102 together form a bus layer, which is described in more detail in connection with FIGS. 3-4 below. Substrate 104 and substrate 105 together form a cavity memory layer, which is described in more detail below in connection with FIG. 2. Substrate 103 is used as an interconnection layer used to interconnect various components within the superconducting device 100. The interconnection layer comprises at least one wiring layer formed from a superconducting material disposed on and/or within the substrate 103 in a pattern that is configured to interconnect different components of the superconducting device 100.

The substrates 101-105 may comprise any suitable material. By way of example and not limitation, the material may include any material with a crystalline structure. For example, silicon or germanium may be used. However, in some embodiments, the substrate material may be insignificant as what controls the behavior of the superconducting device is the superconducting material that coats various portions of the substrate and the troughs that are created within the substrate to form enclosures. Additionally, the substrates 101-105 may be of any suitable dimensions. By way of example and not limitation, the substrates 101-105 may have a thickness ranging from 300 μm to 500 μm.

The superconducting layers of the superconducting device 100 may be formed in any suitable way. In some embodiments, the surface of the substrate is covered with a superconducting material. In other embodiments, one or more channels and/or troughs may be formed in the substrate that are subsequently covered, at least in part, with a superconducting material. Any suitable thickness of superconducting layer may be used. In some embodiments, a superconducting layer of superconducting device 100 may have a thickness ranging from 1 μm to 10 μm. Additionally, any suitable superconducting material may be used. By way of example and not limitation, the superconducting material may include aluminum, niobium, indium, rhenium, tantalum, titanium nitride, and/or niobium nitride.

In some embodiments, superconducting device 100 may communicate to external components via a planar-to-coaxial transition component 150 or any other suitable electronic connection, as known is in the art.

FIG. 1 illustrates a single cross-section of the device showing three separate enclosures 110, 120 and 130. One of skill in the art would recognize that other cross-sections at different positions into and out of the plane of the figure may include additional enclosures that may be coupled to the enclosures 110, 120 and 130 through the wiring layer 140, the vias 142 and 144, and/or additional wiring layers and vias not illustrated. Additionally, the wiring on a given layer or vias between layers may be separately enclosed by additional superconducting layers (not shown) realized by the same, or different, methods. The idea that all electromagnetic signals should be carried on properly designed transmission line structures, such as striplines or coaxial lines, and that these may be realized by the embodiment of our method for realizing superconducting enclosures, should be clear to one skilled in the art.

Figure 2:
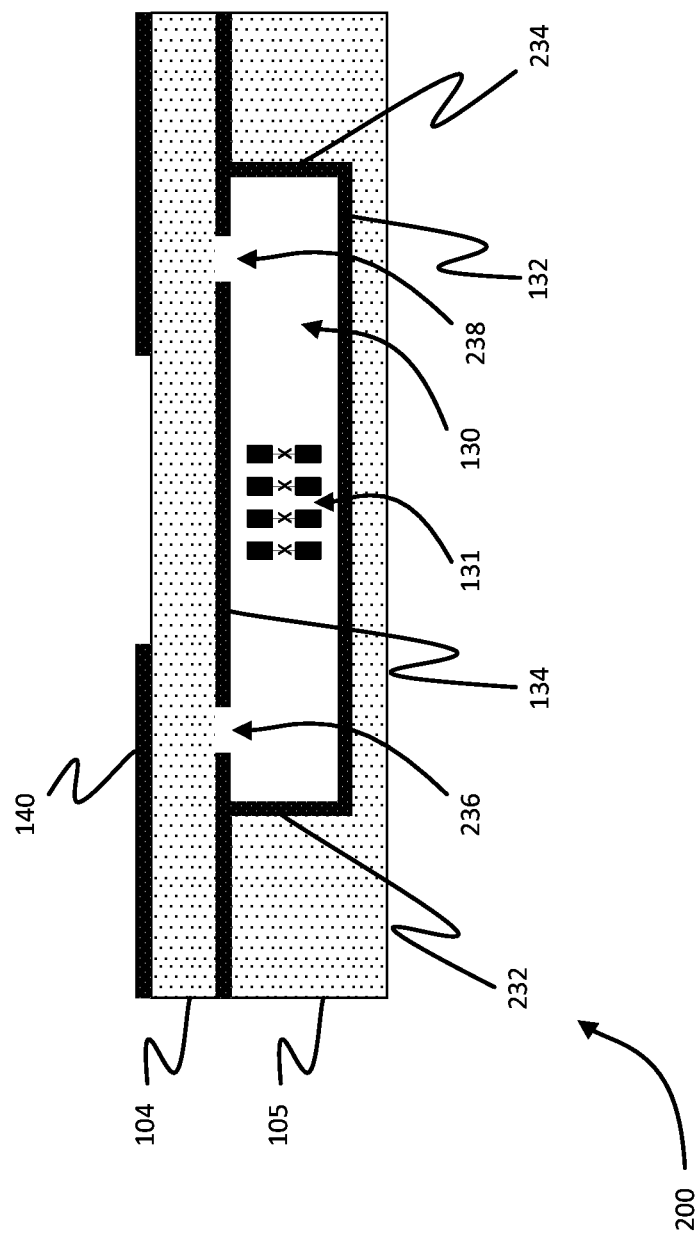
FIG. 2 illustrates a cross-sectional view of a superconducting device comprising a three-dimensional cavity resonator enclosing a plurality of superconducting qubits disposed within the cavity according to some embodiments.

As mentioned above, a cavity memory layer may be formed from substrate 104 and 105. A trough is formed in the substrate 105 and covered, at least in part, with a superconducting layer 132. At least a portion of substrate 104 is also covered in a superconducting layer 134. The trough may be any suitable shape or size. For example, the trough may extend from a surface of the substrate by about 300 μm. The substrates are then positioned such that when connected together, a three-dimensional cavity resonator 130 is formed. FIG. 2 illustrates an embodiment 200 of a cavity memory layer in more detail. The three-dimensional cavity resonator 130 includes at least a first surface 232 and a second surface 234 that are opposed to one another. In some embodiments, the two surfaces are parallel to one other. In other embodiments, the first surface 232 and the second surface 234 may both form a non-perpendicular angle with the superconducting layer 134 associated with substrate 104. In some embodiments, every surface of the three-dimensional cavity resonator 130 is covered, at least in part, with a superconducting material. In some embodiments, each surface of the three-dimensional cavity is covered in its entirety except for two apertures 236 and 238 formed in the superconducting layer 134. The apertures 236 and 238 may be used to couple electromagnetic radiation into the three-dimensional cavity resonator 130 from the wiring layer 140. Other methods of coupling to the cavity, which would be known by those skilled in the art, may also be employed.

The geometry of the three-dimensional cavity resonator 130 determines which frequencies of electromagnetic radiation will be resonant with the cavity. In some embodiments, the three-dimensional cavity resonator 130 may be configured to resonate at microwave frequencies. By way of example and not limitation, the three-dimensional cavity resonator 130 may be configured to resonate at at least one frequency ranging between 1 GHz and 20 GHz. As a further example, the three-dimensional cavity 130 may be configured to resonate at at least one frequency ranging between 5 GHz and 9 GHz.

In some embodiments, the superconducting device 200 may include one or more superconducting qubits 131 disposed within the three-dimensional cavity resonator 130. Any suitable superconducting qubit may be used. By way of example and not limitation, each of the superconducting qubits 131 may be a transmon qubit or a fluxonium qubit. Each of the superconducting qubits 131 may comprise a Josephson junction disposed between two superconducting portions that act as a dipole antenna. In some embodiments the superconducting qubits 131 are oriented vertically such that the axis of each superconducting qubit (as determined by the orientation of the dipole antenna) is perpendicular to the superconducting layer 134 used to form the apertures 236 and 238, and the qubits thereby couple to the electromagnetic fields of the resonant cavity.

In other embodiments, the three-dimensional cavity resonator 130 does not contain a superconducting qubit, but is instead coupled to a superconducting qubit through wiring layer 140. In this way, an external superconducting qubit (not shown) may transfer quantum information to the three-dimensional cavity resonator 130, which may act as a memory for the quantum information.

Quantum information may be stored in the three-dimensional cavity resonator 130 in any suitable way. For example, the energy eigenstates of the electromagnetic field may be used as the computational basis for encoding quantum information. Alternatively, different coherent states and/or superpositions of coherent state (sometimes called "cat states") may be used as the computational basis. Embodiments are not limited to any particular technique for encoding the quantum information in the three-dimensional cavity resonator 130.

As mentioned above, substrate 101 and substrate 102 of FIG. 1 form a bus layer. The bus layer includes enclosure 110 and enclosure 120, which are configured to be electromagnetic shields. Electromagnetic shield 110 includes a plurality of qubits 116 formed on and/or in a support layer 118 that is suspended within the electromagnetic shield 110. Electromagnetic shield 110 includes a superconducting layer 112 and a superconducting layer 114 for enclosing the qubits 116, thereby shielding the qubits 116 from external electromagnetic noise and preventing unwanted electromagnetic radiation from entering the enclosure. The electromagnetic shield 110 also prevents electromagnetic radiation from within the enclosure from leaking to the external environment. Similarly, electromagnetic shield 120 includes a plurality of qubits 126 formed on and/or in a support layer 128 that is suspended within the cavity 120. Electromagnetic shield 120 includes a superconducting layer 122 and a superconducting layer 124 for enclosing the qubits 126, thereby shielding the qubits 126 from external electromagnetic noise and preventing unwanted electromagnetic radiation or cross-coupling to other elements of the device.

Figure 3:
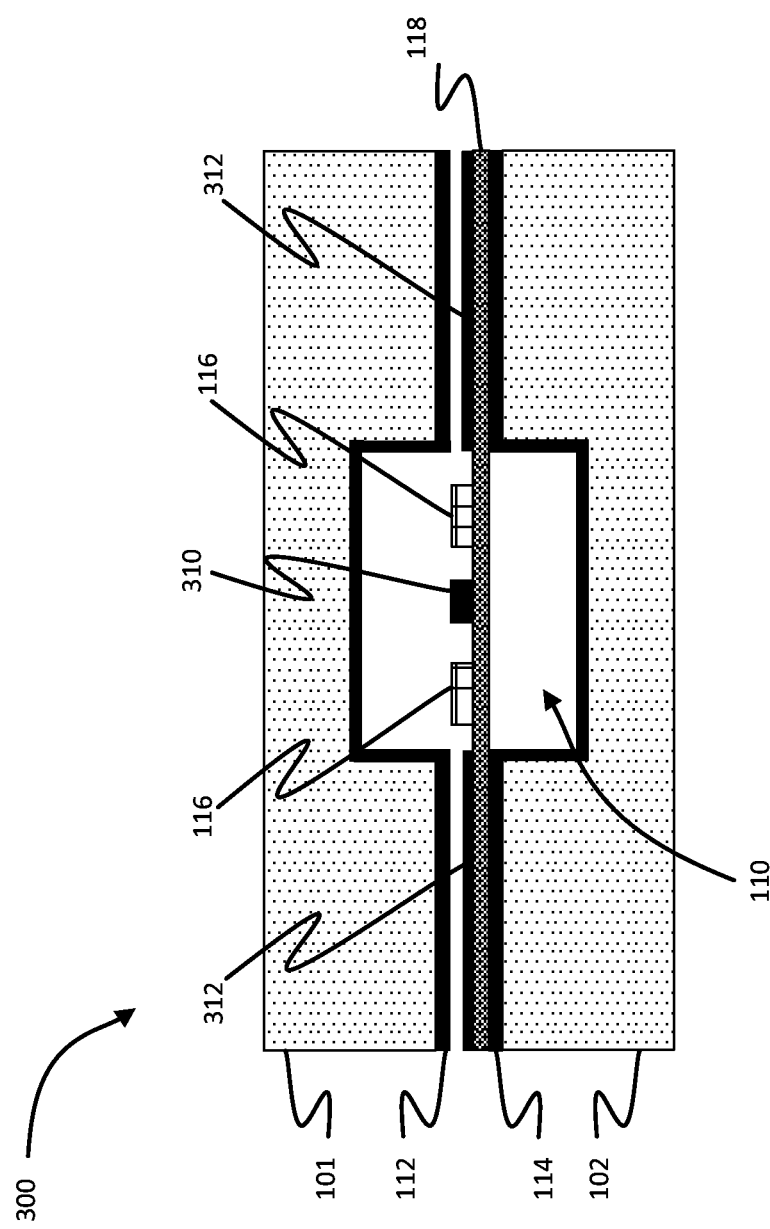
FIG. 3 illustrates a cross-sectional view of a superconducting device comprising an electromagnetic shield and a stripline resonator including a plurality of qubits according to some embodiments.

FIG. 3 illustrates a more detailed cross-sectional view 300 of electromagnetic shield 110 according to some embodiments. Substrate 102 includes a trough from which the electromagnetic shield 110 is formed. At least a portion of the trough is covered with a superconducting layer 114. The superconducting layer 114 may also cover portions of the substrate 102 that are part of the trough. A plurality of qubits 116 are formed in and/or on a support layer 118. In some embodiments, the support layer is a dielectric membrane suspended across the trough in substrate 102. Any suitable material may be used to form the support layer. By way of example and not limitation, the support layer may comprise silicon, silicon oxide, or silicon nitride. The plurality of qubits 116 may be any suitable superconducting qubit, such as a transmon qubit or a fluxonium qubit. Each individual qubit of the plurality of qubits 116 may be individually controlled and/or detected using feed lines 312, which are formed in and/or on the support layer 118. A stripline resonator 310 is disposed between a first plurality of qubits and a second plurality of qubits. In some embodiments, the stripline resonator 310 may be approximately 20 μm wide. The feed lines 312 and the stripline resonator 310 may be formed from any suitable superconducting material.

Substrate 101 also includes a trough that has approximately the same dimensions and the trough in substrate 102. At least a portion of the trough in substrate 101 is covered with a superconducting layer 112. Substrate 101 is disposed near substrate 102 such that a gap exists between feedline 312 and superconducting layer 112. In some embodiments, the gap may be approximately 10 μm. Substrate 101 and substrate 102 may be in contact with each other at a location away from electromagnetic shield 110 such that they may be bonded together. By enclosing the stripline resonator 310 and the plurality of qubits 116 in an electromagnetic shield, the enclosed components are isolated from external electromagnetic noise, and decoherence due to unwanted electromagnetic radiation and cross-couplings are prevented.

Figure 4:
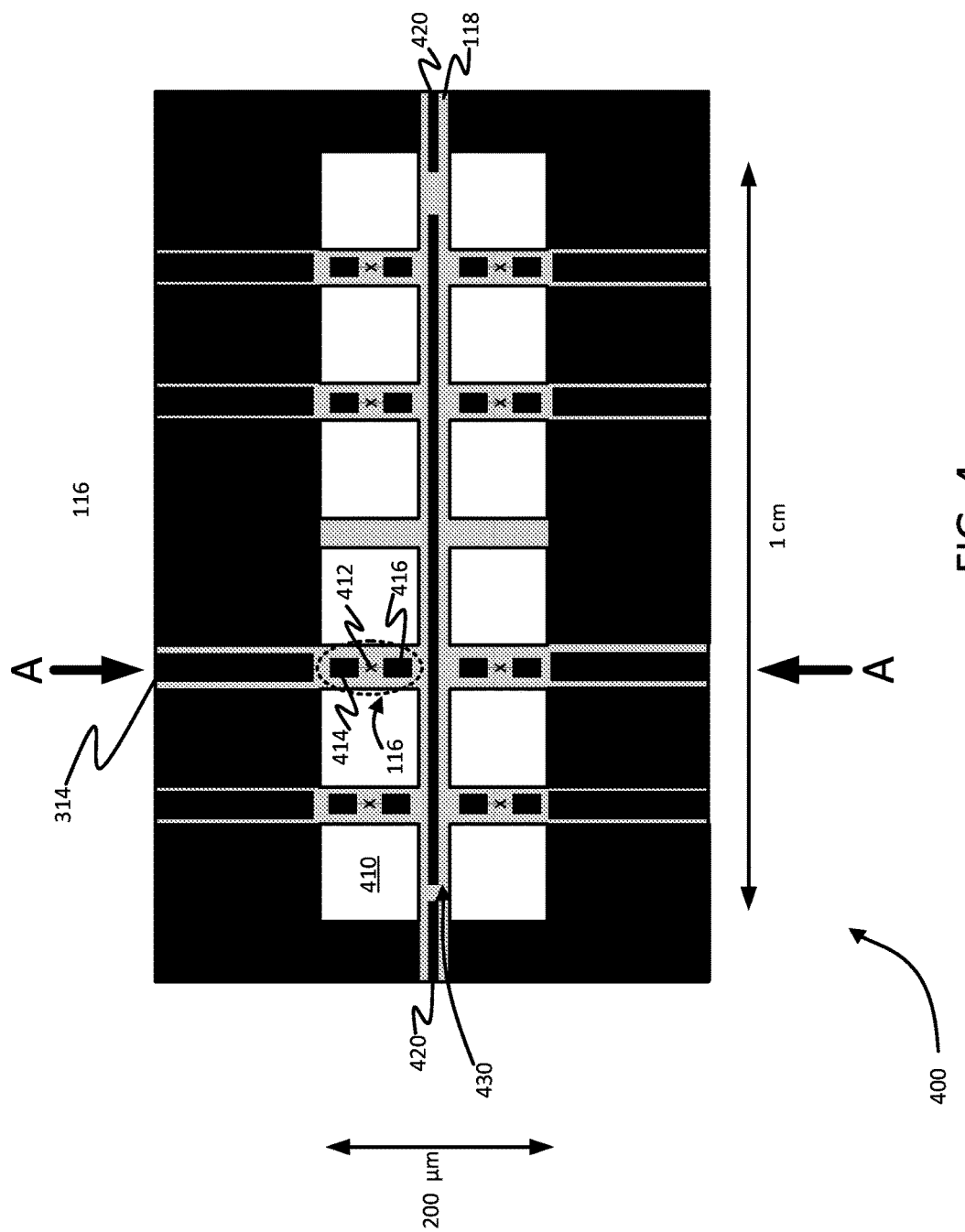
FIG. 4 illustrates a top view of a superconducting device comprising a stripline resonator comprising a plurality of superconducting qubits contained within an electromagnetic shield according to some embodiments.

FIG. 4 illustrates a top view 400 of the support layer 118 and the components included thereon. The arrows indicating "A" illustrate a plane representing the location of the cross-section view 300 of FIG. 3. Membrane 118 includes a plurality of superconducting qubits 116. In some embodiments, each superconducting qubit is a superconducting qubit, such as a transmon qubit or a fluxonium qubit. FIG. 4 illustrates transmon qubits 116 comprising a Josephson junction 412 between a first superconducting portion 414 and a second superconducting portion 416. Each qubit 116 may be individually controlled and/or read-out using drive feed lines 314. A large portion of the surface of the support layer 118 is covered with a superconducting layer as the ground plane for the stripline resonator 430. The stripline resonator 430 is driven via feedlines 420. There is a gap between the feedlines 420 and the stripline resonator such that the two components are weakly, capacitively coupled. Optionally, there are a plurality of holes 410 in the support layer 118 to reduce the amount of dielectric present in the enclosure in which the support layer is disposed and increase the amount of vacuum present in the enclosure, which may increase performance.

Superconducting devices according to certain embodiments may be manufactured in any suitable way. For example, microelectronic fabrication techniques may be used. Alternatively, the substrates may be formed with troughs and channels as desired using three-dimensional printing techniques and the superconducting layers may be formed using, for example, electroplating techniques. Some embodiments may create enclosures by forming a trough in a single substrate, as illustrate in FIG. 2. Alternatively, or in addition, enclosures may be created by forming a first trough in a first substrate and a second trough in a second substrate and placing the two substrates together with the two troughs adjacent to one another. Methods for forming superconducting devices according to some embodiments are described below with reference to FIGS. 5-10.

Figure 5:
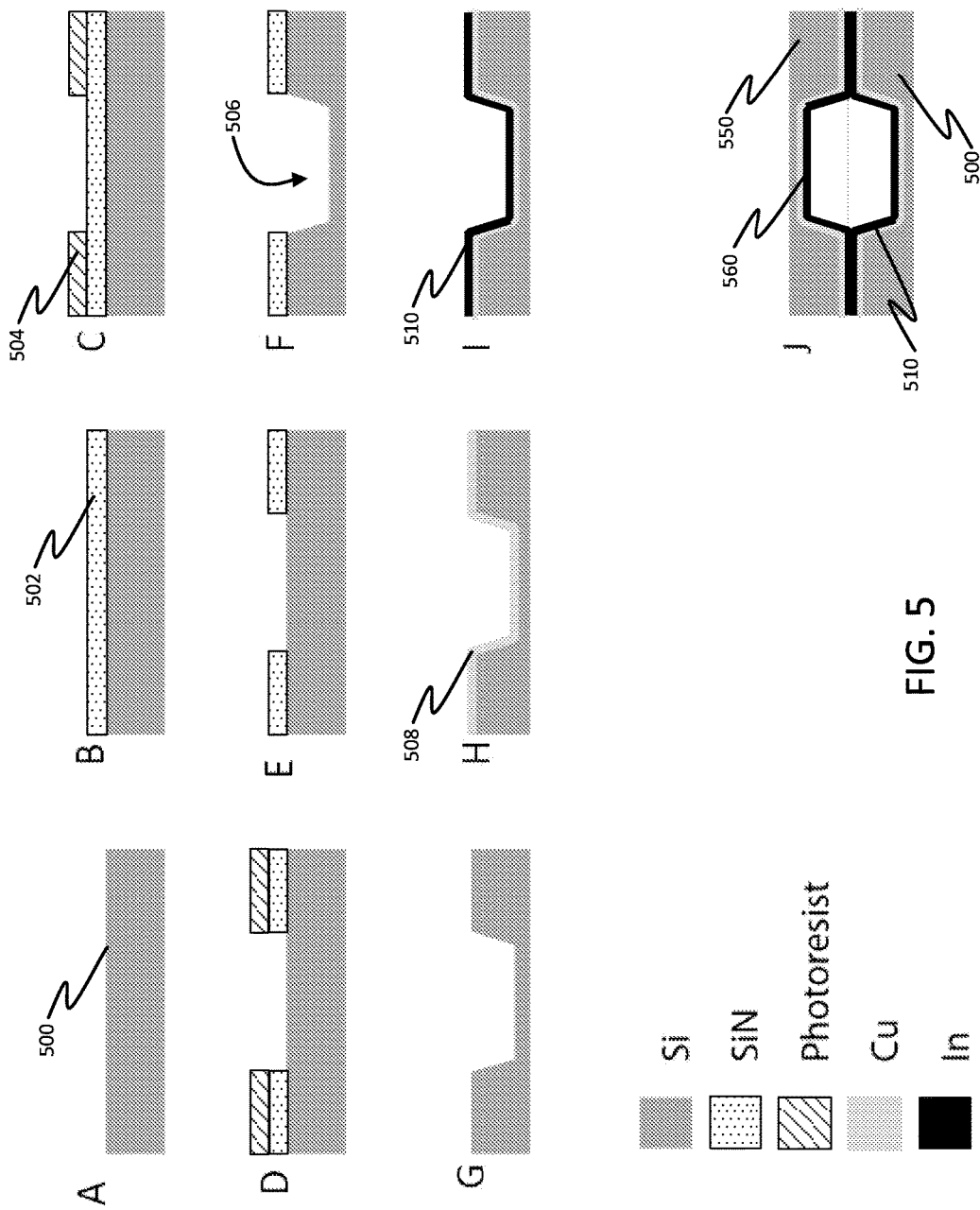
FIG. 5 illustrates a cross-sectional view of a plurality of acts of a method for constructing a superconducting device according to some embodiments.

FIG. 5 illustrates a cross-sectional view of a plurality of acts of a method for constructing a superconducting device according to some embodiments. A flowchart of the acts of the method 700 according to some embodiments is shown in FIG. 7. At act 702, a first trough is formed in a first substrate. The trough may be formed in any suitable way. In some embodiments, the substrate and trough may be printed using three-dimensional printing techniques. In other embodiments, microelectronic fabrication techniques may be used. Details of one such embodiment is now described in connection with FIG. 5, FIG. 6 and FIG. 8.

FIG. 5A illustrates a first substrate 500 being provided. Any suitable substrate may be used. In some embodiments, the substrate may be formed from a material with a crystalline structure. For example, the substrate may comprise silicon or germanium. The substrate 500 may be of any suitable thickness. In the illustrated embodiments, the substrate is approximately 500 μm thick.

At act 802, a silicon nitride layer 502 is deposited on a first surface of the substrate 500 (see FIG. 5B). While silicon nitride is used in the illustrative embodiment of FIG. 5, any suitable material that may act as a mask may be used.

At act 804, a photoresist layer 504 is deposited on top of the silicon nitride layer 502 (see FIG. 5C). The photoresist layer 504 is formed in a pattern based on the dimensions of the trough being formed in the substrate 500. Accordingly, the photoresist layer is absent from the region above where the trough will be formed in the substrate in the subsequent acts. By way of example and not limitation, the photoresist layer 504 may be formed such that an area of the silicon nitride layer 502 with dimensions 18 mm by 38 mm is left exposed.

At act 806, the exposed portion of the silico nitride layer 502 is removed (see FIG. 5D). This may be achieved in any suitable way. In some embodiments, the silicon nitride layer 502 is etched using an etchant that removes the silicon nitride layer, but does not remove the photoresist. For example, reactive ion etching (RIE) may be used to etch the silicon nitride layer. The act of RIE may use, for example, $CHF_3/O_2$ as an etchant. The photoresist layer 504 is then removed at act 808. The resulting structure is the substrate 500 partially covered with the silicon nitride layer 502 which will act as a mask for defining dimensions of the trough (see FIG. 5E).

At act 810, the exposed portion of the substrate 500 is etched to form a trough 506. Any suitable etching may be performed. In some embodiments, the substrate 500 may be etched such that opposing surfaces of the resulting trough 506 are parallel to one another. In the embodiment shown in FIG. 5F, the trough is etched using an anisotropic wet etch using 30% KOH at 85° C. The details of the anisotropic etch is shown in more detail in FIG. 6.

Figure 6:
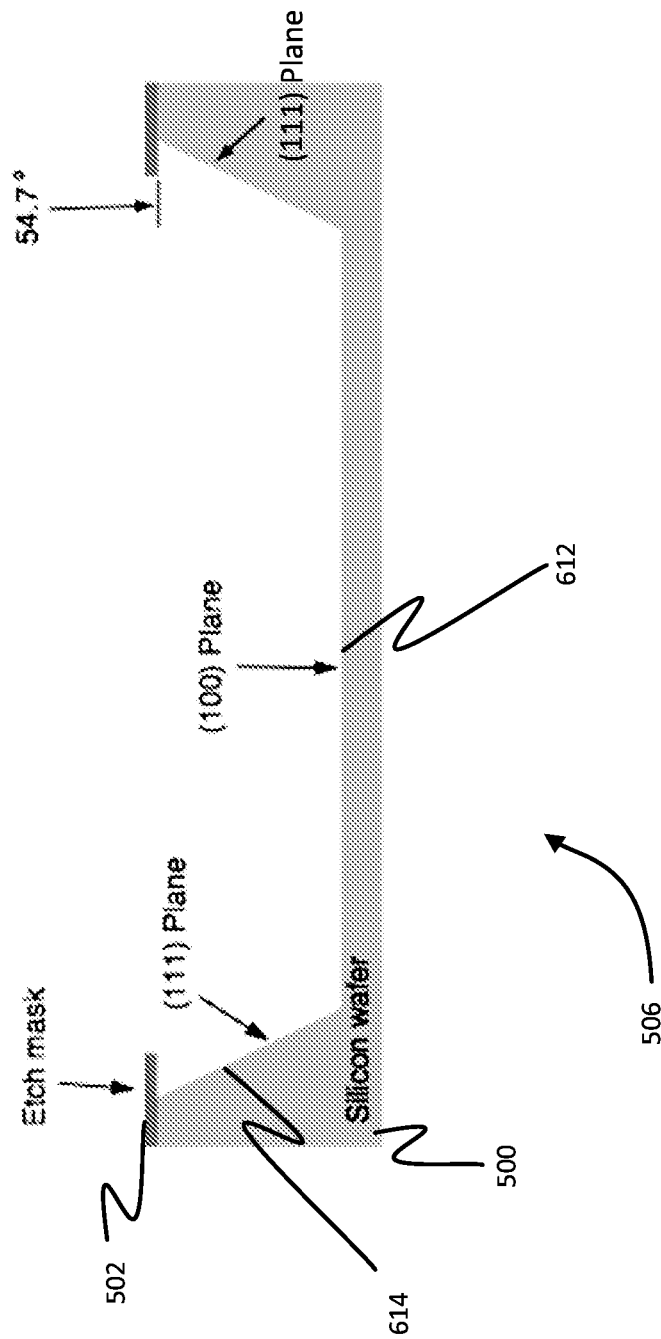
FIG. 6 illustrates a cross-sectional view of forming a trough in a substrate according to some embodiments.
Figure 7:
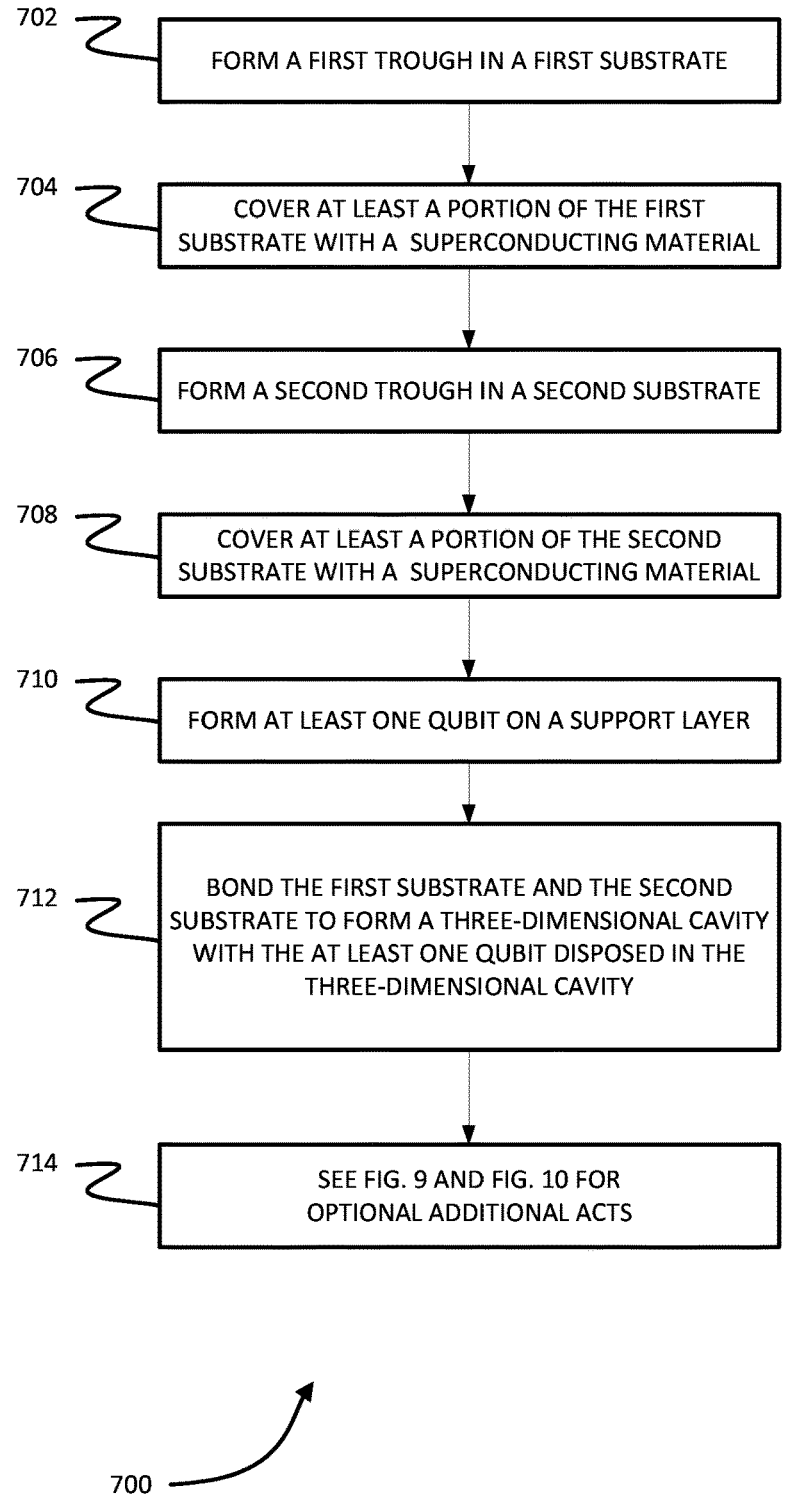
FIG. 7 is a flowchart of a method for constructing a superconducting device according to some embodiments.

FIG. 6 illustrates the trough 506 resulting from an anisotropic wet etch. Because of the crystalline structure of the silicon substrate 500, the (100) plane 612 and the (111) 614 plane for a 54.7° angle as a result of the etching act. In some embodiments, the anisotropic wet etch results in surfaces 612 and 614 that are atomically smooth. Thus, when covered in a superconducting layer the surface of the resulting enclosure will be substantially free from defects. If the enclosure is configured for use as a three-dimensional cavity resonator, the smooth surfaces result in a high Q factor cavity.

Figure 8:
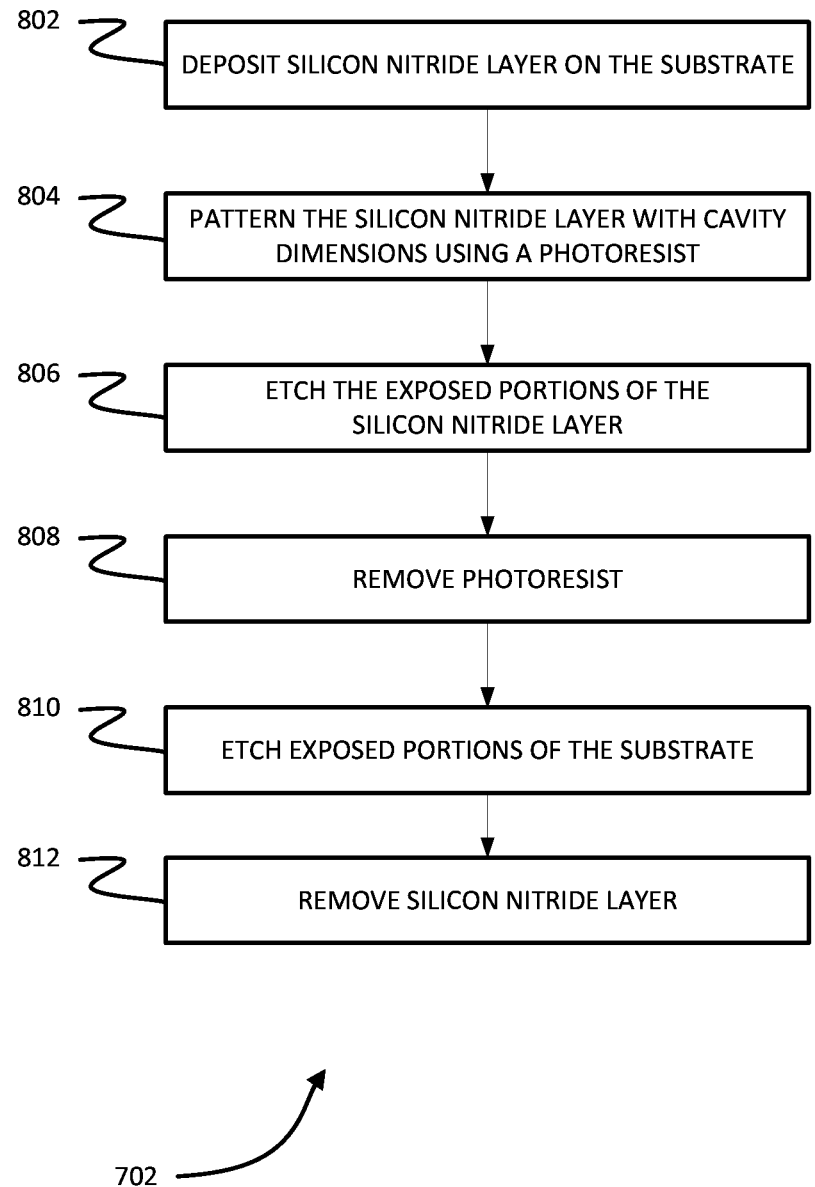
FIG. 8 is a flowchart of a method for forming a trough in a substrate according to some embodiments.

At act 812, the silicon nitride layer is removed resulting in the substrate 500 including the trough 506 (see FIG. 5G). While FIG. 8 illustrated one embodiment of a method for creating a trough in a substrate, any suitable method may be used. For example, laser machining or three-dimensional printing may be used to form a substrate with a trough.

Returning to FIG. 7, after the trough is formed in a substrate at act 702 the method 700 continues at act 704, where at least a portion of the first substrate is covered with a superconducting material. In some embodiments, all the surfaces of the trough in the substrate may be covered. In other embodiments, only portions of the surfaces may be covered. In this way, for example, apertures may be formed. In some embodiments, portions of the substrate outside of the region associated with the trough may also be covered with a superconducting layer.

The superconducting layer may be formed in any suitable way. For example, FIGS. 5H-I illustrate one particular method for forming a superconducting layer that covers at least a portion of the substrate. FIG. 5H illustrates a thin seed layer 508 is deposited over the surface of the substrate 500. This may be done in any suitable way. In some embodiments, copper is deposited via evaporation techniques to form the seed layer 508. Any suitable thickness of seed layer may be used. For example, the seed layer 508 may be approximately 200 nm thick. While copper is used as an example material for the seed layer 508, any suitable material may be used.

FIG. 5I illustrates a superconducting layer 510 formed on the seed layer 508. This may be done in any suitable way. For example, a superconducting material may be electroplated onto the seed layer. The superconducting layer 510 may be formed with any suitable thickness. For example, the superconducting layer 510 may be approximately 10 μm thick. Any suitable superconducting material may be used. For example, the superconducting layer may comprise aluminum, niobium, indium, rhenium, tantalum, titanium nitride, or niobium nitride.

At act 706, a second trough is formed in a second substrate. The act of forming the second trough may be achieved using the same techniques described in connection with act 702, FIG. 5 and FIG. 8. However, the formation of the second trough is optional. An enclosure may be formed from a single trough in a first substrate without forming a second trough in a second substrate.

At act 708, at least a portion of the second substrate is covered with a superconducting material. This act may be achieved using the techniques described in connection with act 704. In embodiments where a second trough is formed in the second substrate, at least a portion of every surface of the trough may be covered with a superconducting layer. In some embodiments, a portion of the second substrate outside of the trough region may be at least partially covered with a superconducting layer.

At act 710, at least one superconducting qubit is formed on a support layer. In some embodiments, the support layer may be any suitable dielectric membrane. For example, the support layer may comprise silicon, silicon oxide, or silicon nitride. In some embodiments, act 710 may be omitted as superconducting devices may be formed without a superconducting qubit being enclosed in an enclosure.

At act 712, the first substrate and the second substrate are bonded together to form an enclosure. In embodiments where the first trough was formed in the first substrate and a second trough was formed in the second substrate, the two troughs are positioned adjacent to one another such that the enclosure is formed from both troughs together. In some embodiments where at least one superconducting qubit is to be enclosed by an enclosure, the support layer is suspended across the first trough prior to bonding the two substrates together. Accordingly, the at least one qubit in and/or on the support layer is disposed within the enclosure.

Figure 9:
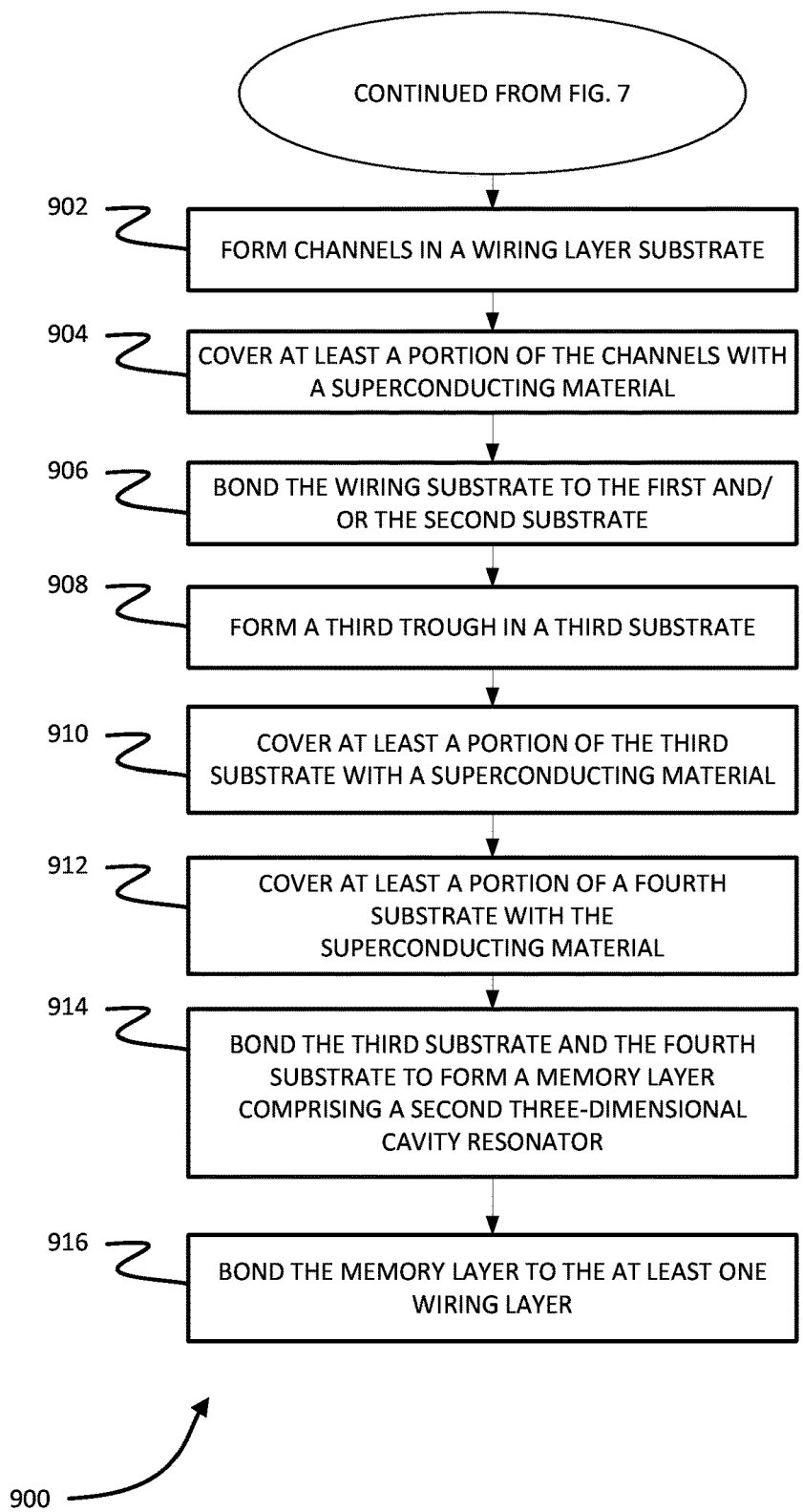
FIG. 9 is a method for constructing a superconducting device according to some embodiments.
Figure 10:
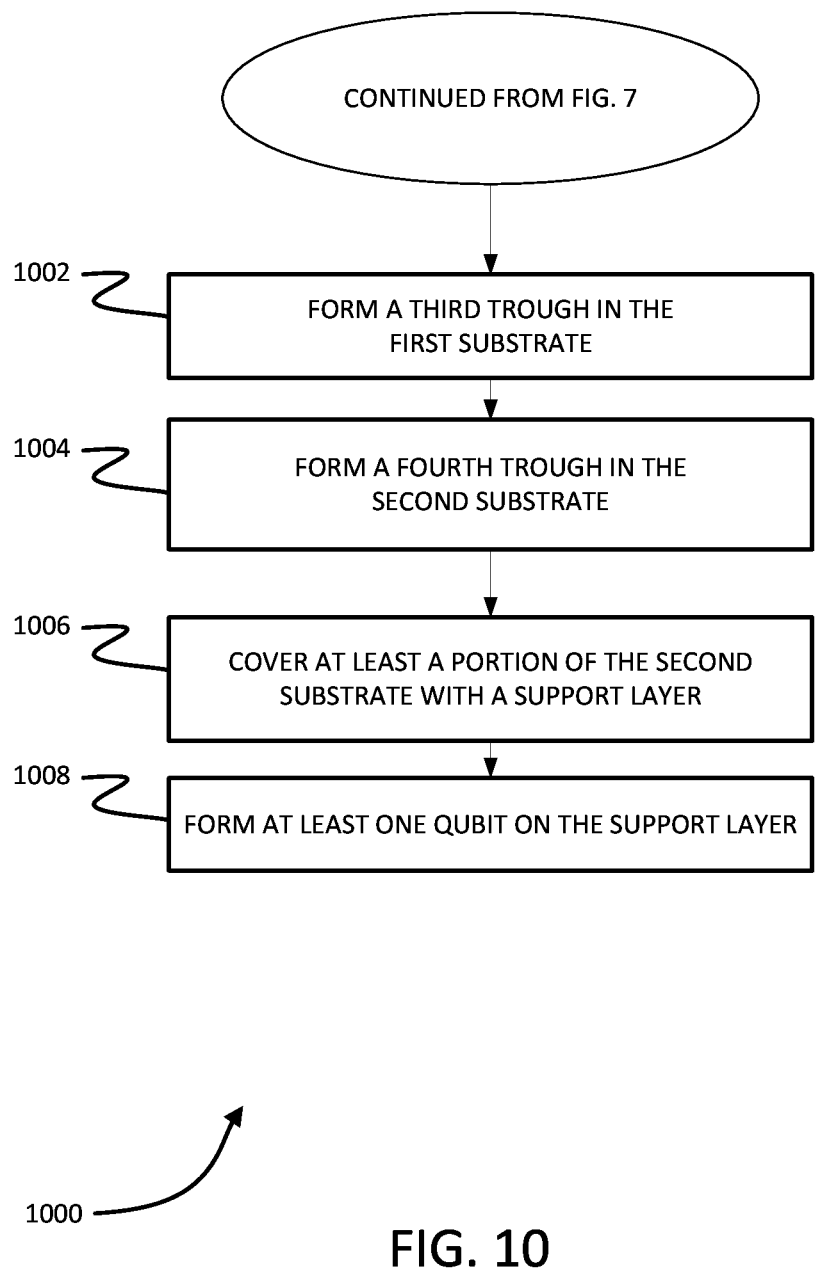
FIG. 10 is a method for constructing a superconducting device according to some embodiments.

The method 700 may also include additional optional acts shown in FIG. 9 and FIG. 10. For example, the result of performing method 700 may be the formation of enclosure 110 in the bus layer of FIG. 1. FIG. 9 illustrates additional acts for forming the wiring layer 140 and the memory layer enclosure 130. FIG. 10 illustrates additional acts for forming the second enclosure 120 in the bus layer.

FIG. 9 illustrates additional acts 900 for forming the wiring layer and the memory layer. In some embodiments, the additional acts may be performed after the method 700. In other embodiments, the additional acts may be performed before the method 700 or simultaneously with method 700.

At act 902, at least one channel is formed in wiring layer substrate 103 (see FIG. 1). The at least one channel may be formed, for example, using the same process used to create the trough in act 702.

At act 904, at least a portion of the at least one channel is covered with superconducting material. This may be achieved using the same process used above in connection with act 704. In some embodiments, the channel may be completely filled with superconducting material. In other embodiments, the one or more of the surfaces of the at least one channel may be covered with the superconducting material.

At act 906, the wiring substrate 103 is bonded to substrate 102. The substrates may be bonded in any suitable way, as discussed above.

At act 908, a trough is formed in substrate 105 using, for example, the same process used to create the trough in act 702.

At act 910, at least a portion of substrate 105 is covered with a superconducting material. This may be achieved using the same process used above in connection with act 704. In some embodiments, each surface of the through is completely covered with superconducting material. The superconducting material is formed in a layer that may be any suitable thickness. In some embodiments, the superconducting layer may be approximately 1 μm thick. In other embodiments, the superconducting layer may be approximately 10 μm thick.

At act 912, at least a portion of substrate 104 is covered with a superconducting material. This may be achieved using the same process used above in connection with act 704. Certain portions of a surface of substrate 104 may be left exposed. For example, the area corresponding to apertures 236 and 238 in FIG. 2 may not be covered with superconducting material.

At act 914, substrate 104 is bonded to substrate 105 such that the trough forms a three-dimensional cavity resonator. The substrates may be bonded in any suitable way, as discussed above.

At act 916, the memory layer is bonded to the wiring layer. The substrates associated with the layers may be bonded in any suitable way, as discussed above.

FIG. 10 illustrates additional acts for forming the second enclosure 120 in the bus layer.

At act 1002, a trough associated with enclosure 120 is formed in the substrate 101 using, for example, the same process used to create the trough in act 702. In some embodiments, the trough associate with enclosure 120 may be formed simultaneously with the trough associated with enclosure 110.

At act 1004, a trough associated with enclosure 120 is formed in the substrate 102 using, for example, the same process used to create the trough in act 702. In some embodiments, the trough associate with enclosure 120 may be formed simultaneously with the trough associated with enclosure 110.

At act 1006, at least a portion of substrate 102 may be covered with a support layer which is suspended over the trough associated with enclosure 120. This support layer may be formed in the same way as the support layer associated with enclosure 110.

At act 1008, at least one qubit is formed on the support layer. This at least one qubit may be formed in the same way as the support layer associated with enclosure 110.

Having thus described several aspects of at least one embodiment of a superconducting device and at least one method for manufacturing a superconducting device, it is to be appreciated that various alterations, modifications, and improvements will readily occur to those skilled in the art. For example, superconducting enclosures of any size may be included. Some enclosures may have dimensions on the order of a centimeter, a millimeter, or a micrometer. Such alterations, modifications, and improvements are intended to be part of this disclosure, and are intended to be within the spirit and scope of the invention. While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated, those of ordinary skill in the art will readily envision a variety of other means and/or structures for performing the function and/or obtaining the results and/or one or more of the advantages described, and each of such variations and/or modifications is deemed to be within the scope of the inventive embodiments described. More generally, those skilled in the art will readily appreciate that all parameters, dimensions, materials, and configurations described are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure may be directed to each individual feature, system, system upgrade, and/or method described. In addition, any combination of two or more such features, systems, and/or methods, if such features, systems, system upgrade, and/or methods are not mutually inconsistent, is included within the inventive scope of the present disclosure.

Further, though some advantages of the described embodiments may be indicated, it should be appreciated that not every embodiment will include every described advantage. Some embodiments may not implement any features described as advantageous. Accordingly, the foregoing description and drawings are by way of example only.

The section headings used are for organizational purposes only and are not to be construed as limiting the subject matter described in any way.

Also, the technology described may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. In addition, certain acts performed as part of the method may be optional. Accordingly, embodiments may be constructed in which certain acts are not performed at all.

All definitions, as defined and used, should be understood to control over dictionary definitions, definitions in documents incorporated by reference, and/or ordinary meanings of the defined terms.

The terms "about," "approximately," and "substantially" may be used to refer to a value, and are intended to encompass the referenced value plus and minus acceptable variations. The amount of variation could be less than 5% in some embodiments, less than 10% in some embodiments, and yet less than 20% in some embodiments. In embodiments where an apparatus may function properly over a large range of values, e.g., a range including one or more orders of magnitude, the amount of variation could be a factor of two. For example, if an apparatus functions properly for a value ranging from 20 to 350, "approximately 80" may encompass values between 40 and 160.

The indefinite articles "a" and "an," as used in the specification and in the claims, unless clearly indicated to the contrary, should be understood to mean "at least one."

The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

What is claimed is:

1. A method for manufacturing a superconducting device, the method comprising acts of:
    forming at least one trough in at least a first substrate;
    covering at least a portion of the first substrate with a superconducting material;
    covering at least a portion of a second substrate with the superconducting material; and
    bonding the first substrate and the second substrate to form at least one enclosure comprising the at least one trough and the superconducting material such that the portion of the first substrate covered with the superconducting material is opposed to, and displaced from, the portion of the second substrate covered with the superconducting material;
    forming channels in at least one wiring layer substrate;
    covering at least a portion of the channels with the superconducting material to form a wiring layer; and
    bonding the at least one wiring layer substrate to the first substrate and/or the second substrate.

2. The method of claim 1, wherein the act of forming the at least one trough comprises acts of:
    forming a mask layer that covers a portion of the first substrate; and
    etching a portion of the first substrate not covered by the mask layer.

3. The method of claim 2, wherein the act of etching comprises an act of anisotropic etching.

4. The method of claim 3, wherein the act of anisotropic etching uses a wet etchant.

5. The method of claim 2, wherein the mask layer comprises silicon nitride.

6. The method of claim 1, wherein the act of forming at least one trough in at least a first substrate comprises:
    forming a first trough in the first substrate; and
    forming a second trough in the second substrate, wherein the at least one enclosure comprises a first enclosure formed from the first trough and the second trough.

7. The method of claim 6, wherein the at least one enclosure is configured to form at least one electromagnetic shield such that external electromagnetic radiation is prevented from entering the at least one enclosure.

8. The method of claim 7, further comprising:
    forming at least one superconducting component within the first enclosure.

9. The method of claim 8, wherein the at least one superconducting component comprises at least one superconducting circuit.

10. The method of claim 8, wherein the at least one superconducting component comprises at least one qubit.

11. The method of claim 10, further comprising:
    covering at least a portion of said second substrate with a support layer, wherein the at least one qubit is disposed on and/or within the support layer.

12. The method of claim 10, wherein the at least one superconducting component comprises at least one stripline resonator.

13. The method of claim 12, wherein the act of forming at least one trough in at least a first substrate further comprises forming a third trough in a third substrate, the method further comprising:
    covering at least a portion of the third substrate with the superconducting material;
    covering at least a portion of a fourth substrate with the superconducting material;
    bonding the third substrate and the fourth substrate to form a memory layer comprising a second enclosure from the third trough; and
    bonding the memory layer to the at least one wiring layer substrate.

14. The method of claim 13, wherein:
    the wiring layer couples the second enclosure to the first enclosure.

15. The method of claim 14, wherein:
    the first enclosure is electrically connected to the wiring layer.

16. The method of claim 13, wherein:
    a Q factor of the second enclosure is greater than a Q factor of the first enclosure.

17. The method of claim 1, further comprising:
    coupling at least one qubit to the at least one enclosure.

18. The method of claim 17, wherein coupling the at least one qubit to the at least one enclosure comprises forming the at least one qubit within the at least one enclosure.

19. The method of claim 17, wherein the at least one qubit is a transmon qubit.

20. The method of claim 17, wherein the at least one qubit is a fluxonium qubit.

21. The method of claim 1, wherein the act of covering at least a portion of the first substrate with a superconducting material comprises acts of:
   forming a seed layer on at least the portion of the first substrate; and
   electroplating the superconducting material onto the seed layer.

22. The method of claim 1, wherein the superconducting material is selected from the group consisting of aluminum, niobium, indium, rhenium, tantalum, titanium nitride, and niobium nitride.

23. The method of claim 1, wherein at least one of the first substrate and the second substrate comprises a semiconductor.

24. The method of claim 1, wherein the at least one enclosure is configured to form at least one three-dimensional cavity resonator such that electromagnetic radiation at one or more frequencies resonates within the at least one three-dimensional cavity resonator.

25. The method of claim 1, wherein the portion of the first substrate is oriented parallel to the portion of the second substrate.

* * * * *